(12) United States Patent
Pun et al.

(10) Patent No.: US 11,189,766 B2
(45) Date of Patent: Nov. 30, 2021

(54) LIGHT EMITTING DIODE PACKAGES

(71) Applicant: Cree, Inc., Durham, NC (US)

(72) Inventors: Arthur F. Pun, Raleigh, NC (US); Colin Blakely, Franklinton, NC (US); Kyle Damborsky, Morrisville, NC (US); Jae-Hyung Jeremiah Park, Cary, NC (US)

(73) Assignee: CreeLED, Inc., Durham, NC (US)

( * ) Notice: Subject to any disclaimer, the term of this patent is extended or adjusted under 35 U.S.C. 154(b) by 0 days.

(21) Appl. No.: 16/249,246

(22) Filed: Jan. 16, 2019

(65) Prior Publication Data

US 2020/0227603 A1 Jul. 16, 2020

(51) Int. Cl.
*H01L 33/00* (2010.01)
*H01L 33/62* (2010.01)
*H01L 25/075* (2006.01)
*H01L 33/32* (2010.01)
*H01L 33/64* (2010.01)

(52) U.S. Cl.
CPC .......... *H01L 33/62* (2013.01); *H01L 25/0753* (2013.01); *H01L 33/32* (2013.01); *H01L 33/642* (2013.01)

(58) Field of Classification Search
CPC ..... H01L 25/0753; H01L 33/32; H01L 33/62; H01L 33/642; H01L 33/486; H01L 33/647
See application file for complete search history.

(56) References Cited

U.S. PATENT DOCUMENTS

| | | | |
|---|---|---|---|
| 8,410,371 B2 | 4/2013 | Andrews et al. | |
| 8,410,512 B2 | 4/2013 | Andrews | |
| 8,866,169 B2 | 10/2014 | Emerson et al. | |
| 9,070,850 B2 | 6/2015 | Keller et al. | |
| 9,887,327 B2 | 2/2018 | Reiherzer et al. | |
| 2004/0188696 A1* | 9/2004 | Hsing Chen ............ | H01L 24/97 257/99 |
| 2015/0179903 A1 | 6/2015 | Pun et al. | |
| 2016/0148860 A1 | 5/2016 | Blakely et al. | |
| 2016/0149104 A1 | 5/2016 | Bergmann et al. | |
| 2017/0098746 A1 | 4/2017 | Bergmann et al. | |

* cited by examiner

*Primary Examiner* — Meiya Li
(74) *Attorney, Agent, or Firm* — Withrow & Terranova, PLLC

(57) ABSTRACT

Solid-state lighting devices including light-emitting diodes (LEDs) and LED packages are disclosed. LED packages are provided with improved thermal and/or electrical coupling between LED chips and submounts or lead frames. Various configurations of submounts with via arrangements are disclosed to provide improved coupling between LED chips and submounts. LED chip contacts are disclosed with one or more openings that are registered with vias to provide more uniform mounting. Multiple LED chips may be arranged around a thermally conductive element on a submount, and a via in the submount may be registered with the thermally conductive element. Subassemblies are provided between LED chips and lead frames to improve electrical and thermal coupling. Underfill materials may be arranged between LED chips and lead frames to provide improved mechanical support.

15 Claims, 12 Drawing Sheets

LIGHT EMITTING DIODE PACKAGES

TECHNICAL FIELD

The present disclosure relates to solid-state lighting devices including light-emitting diodes (LEDs) and more particularly to LED packages.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, aluminum nitride, gallium arsenide-based materials, and/or from organic semiconductor materials. LED packages are solid-state devices that incorporate one or more LED chips into a packaged device. An LED chip may be enclosed in a component package to provide environmental and/or mechanical protection, light focusing and the like.

Typically, it is desirable to operate LED chips and LED packages at the highest light emission efficiencies possible, which can be measured by the emission intensity in relation to the input power (e.g., in lumens per watt). As light emission intensities of LED chips and LED components continue to increase, more heat can be generated from LED chips, which can adversely impact operating efficiencies. Additionally, challenges exist in manufacturing LED packages that incorporate LED chips mounted to die attach pads. The art continues to seek improved LEDs and solid-state lighting devices having increased light output and increased light emission efficiencies without impairing manufacturability and reliability of such devices, while providing desirable illumination characteristics capable of overcoming challenges associated with conventional lighting devices.

SUMMARY

The present disclosure relates to solid-state lighting devices including light-emitting diodes (LEDs), and more particularly to LED packages. LED packages as disclosed herein are configured to provide improved thermal and/or electrical coupling between LED chips and submounts or between LED chips and lead frames. In certain embodiments, LED packages include submounts incorporating electrically conductive vias, with such vias being configured to provide improved thermal contact between LED chips and submounts. LED chips may further include contacts with one or more openings that are registered with vias to provide more uniform mounting between LED chips and submounts. In certain embodiments, multiple LED chips are arranged around a thermally conductive element on a surface of a submount, and a via in the submount may be registered with the thermally conductive element. In certain embodiments, subassemblies are provided between LED chips and lead frames to improve electrical and thermal coupling. In certain embodiments, underfill materials are arranged between LED chips and lead frames to provide improved mechanical support. According to the embodiments disclosed herein, LED packages are provided with thermal capabilities that allow operation at higher powers with increased power densities.

In one aspect, an LED package comprises: a submount comprising a first face, a second face that opposes the first face, a die attach pad on the first face, and at least one via that comprises an electrically conductive material and that extends between the first face and the second face, wherein the die attach pad is registered with the at least one via; and an LED chip comprising a contact pad that is coupled with the die attach pad, wherein the contact pad defines at least one opening that is registered with the at least one via. The die attach pad may be electrically coupled with the at least one via. In certain embodiments, each opening of the at least one opening comprises a recess having a maximum depth smaller than a thickness of the contact pad. In certain embodiments, each opening of the at least one opening comprises an aperture extending through an entire thickness of the contact pad. In certain embodiments, the at least one via comprises a plurality of vias, wherein the die attach pad is registered with the plurality of vias. In certain embodiments, the at least one opening comprises a plurality of openings that are registered with the plurality of vias. In certain embodiments, the at least one via comprises a plurality of vias that overlap with one another to form a trench via. In certain embodiments, the at least one opening comprises a trench opening that is registered with the trench via. In certain embodiments, the LED chip is one of a plurality of LED chips that are mounted on the submount; the at least one via comprises a plurality of vias; the die attach pad is one of a plurality of die attach pads on the first face; and each LED chip of the plurality of LED chips is coupled with a different die attach pad of the plurality of die attach pads, and each LED chip comprises a contact pad that defines an opening registered with a different via of the plurality of vias. The LED chip may comprise a multiple-junction LED chip that is mounted on the submount. In certain embodiments, the at least one via comprises three vias that are positioned relative to one another in the submount to form vertices of a triangle.

In another aspect, an LED package comprises: a submount comprising a first face, a second face that opposes the first face, a first die attach pad on the first face, a second die attach pad on the first face, a first plurality of vias registered with the first die attach pad, and a second plurality of vias registered with the second die attach pad; and an LED chip comprising a primary light emitting face, a mounting face that opposes the primary light emitting face, an anode contact pad on the mounting face, and a cathode contact pad on the mounting face; wherein the anode contact pad is coupled with the first die attach pad, and the cathode contact pad is coupled with the second die attach pad. The LED package of claim B1, wherein the first plurality of vias is electrically coupled with the first die attach pad, and the second plurality of vias is electrically coupled with the second die attach pad. In certain embodiments, the anode contact pad comprises a plurality of openings, and openings of the plurality of openings are registered with vias of the first plurality of vias. In certain embodiments, the cathode contact pad comprises a plurality of openings, and openings of the plurality of openings are registered with vias of the second plurality of vias. In certain embodiments, the anode contact pad comprises a first plurality of openings, and openings of the first plurality of openings are registered with vias of the first plurality of vias; and the cathode contact pad comprises a second plurality of openings, and openings of the second plurality of openings are registered with vias of the second plurality of vias. The submount may comprise at least one additional via that is arranged outside of a mounting area defined by lateral boundaries of the LED chip. In certain embodiments, at least one via of the first plurality of vias extends into but not completely through the first die attach pad, and at least one via of the second plurality of vias extends into but not completely through the second die attach pad. The first plurality of vias and the second plurality of vias may be electrically isolated from the first die attach pad and the second die attach pad. In certain embodiments, at least one via of the first plurality of vias and/or at least one of the second plurality of vias extends in the submount at an oblique angle between the first face and the second face.

In another aspect, an LED package comprise: a first submount comprising a first face and a second face that opposes the first face, the first submount further comprising a plurality of vias that extend between the first face and the second face; a second submount comprising a first die attach pad, wherein the first die attach pad is registered with the plurality of vias; and an LED chip comprising a first contact pad that is coupled with the first die attach pad. In certain embodiments, the second submount is arranged between the LED chip and the first submount. In certain embodiments, the plurality of vias extend less than an entire distance between the first face and the second face of the first submount. In certain embodiments, the plurality of vias extend completely through the first submount.

In another aspect, an LED package comprises: a submount comprising a first face and a second face that opposes the first face, the submount further comprising a via that comprises a thermally conductive material and that extends between the first face and the second face; a thermally conductive element on the first face and registered with the via; and a plurality of LED chips on the first face, wherein each LED chip of the plurality of LED chips is arranged adjacent to a different lateral edge of the thermally conductive element. In certain embodiments, the via is configured with a same cross-sectional width or diameter as the thermally conductive element. In certain embodiments, the via is configured with a larger cross-sectional width or diameter than the thermally conductive element. The LED package may further comprise a package bond pad on the second face of the submount, wherein the package bond pad is registered with the via. In certain embodiments, a corner of each LED chip of the plurality of LED chips is arranged closest to a different corner of the thermally conductive element.

In another aspect, an LED package comprises: an LED chip mounted to a lead frame; and a subassembly arranged between the LED chip and the lead frame, wherein the subassembly comprises a metal submount that is thermally coupled between the LED chip and the lead frame. In certain embodiments, the subassembly further comprises: a first die attach pad that is configured to be electrically coupled with a first contact pad of the LED chip; and a second die attach pad that is configured to be electrically coupled with a second contact pad of the LED chip. In certain embodiments, the first die attach pad and the second die attach pad are electrically coupled to different portions of the lead frame by wirebonds. In certain embodiments, the subassembly further comprises a dielectric layer arranged between the first die attach pad and the metal submount, and arranged between the second die attach pad and the metal submount. In certain embodiments, the LED chip is arranged in a flip-chip configuration on the first die attach pad and the second die attach pad. The LED package may further comprise an underfill material arranged between the subassembly and the lead frame.

In another aspect, an LED package comprises: an LED chip mounted to a lead frame; a underfill material arranged between the LED chip and the lead frame; and an encapsulant material arranged on the LED chip and the underfill material. In certain embodiments, a first contact of the LED chip is electrically and mechanically coupled with a first lead frame portion, and a second contact of the LED chip is electrically and mechanically coupled with a second lead frame portion. In certain embodiments, the underfill material is arranged between the first lead frame portion and the second lead frame portion. In certain embodiments, the underfill material is arranged between the first contact of the LED chip and the second contact of the LED chip. In certain embodiments, the underfill material comprises light altering particles. In certain embodiments, the underfill material comprises a material with a higher durometer value on a Shore D hardness scale than the encapsulant material.

In another aspect, an LED package comprises: a submount comprising a first face, a second face that opposes the first face, a die attach pad on the first face, and a plurality of vias registered with the die attach pad, wherein outermost vias of the plurality of vias are arranged to form vertices of a non-rectangular polygonal shape; and an LED chip comprising a primary light emitting face and a mounting face that opposes the primary light emitting face, and at least a portion of the mounting face is thermally coupled to the die attach pad. In certain embodiments, the plurality of vias are arranged in an asymmetric pattern. In certain embodiments, a spacing between adjacent vias of the plurality of vias is smaller near the center of the die attach pad than along a perimeter of the die attach pad. In certain embodiments, the plurality of vias comprises three vias that are positioned relative to one another in the submount to form vertices of a triangle.

In another aspect, an LED package comprises: a submount comprising a first face, a second face that opposes the first face, a die attach pad on the first face, and a plurality of vias registered with the die attach pad, wherein a spacing between adjacent vias of the plurality of vias is smaller in certain areas of the die attach pad than in other areas the die attach pad; and an LED chip comprising a primary light emitting face and a mounting face that opposes the primary light emitting face, and at least a portion of the mounting face is thermally coupled to the die attach pad. In certain embodiments, the spacing between the adjacent vias of the plurality of vias is smaller near the center of the die attach pad than along a perimeter of the die attach pad. In certain embodiments, the spacing between the adjacent vias of the plurality of vias is smaller along a perimeter of the die attach pad. In certain embodiments, the plurality of vias form an array of closely spaced via clusters along the die attach pad. In certain embodiments, the die attach pad is electrically coupled with the plurality of vias. In certain embodiments, the die attach pad is electrically isolated with the plurality of vias.

In another aspect, any one or more aspects or features described herein may be combined with any one or more other aspects or features for additional advantage.

Other aspects and embodiments will be apparent from the detailed description and accompanying drawings.

Those skilled in the art will appreciate the scope of the present disclosure and realize additional aspects thereof after reading the following detailed description of the preferred embodiments in association with the accompanying drawing figures.

DETAILED DESCRIPTION

Figure 1:
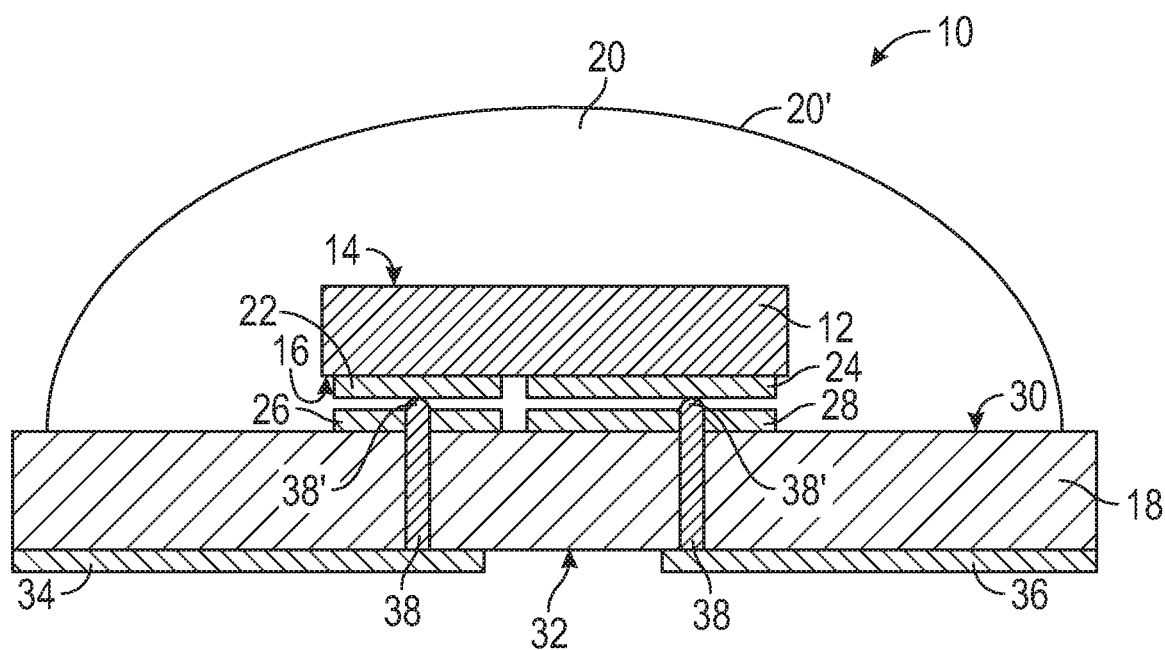
FIG. 1 is a cross-sectional view of a representative LED package that includes an LED chip mounted on a submount.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to solid-state lighting devices including light-emitting diodes (LEDs) and more particularly to LED packages. LED packages as disclosed herein are configured to provide improved thermal and/or electrical coupling between LED chips and submounts or between LED chips and lead frames. In certain embodiments, LED packages include submounts with via arrangements configured to provide improved thermal contact between LED chips and submounts. LED chips may further include contacts with one or more openings that are registered with vias to provide more uniform mounting between LED chips and submounts. In certain embodiments, multiple LED chips are arranged around a thermally conductive element on a surface of a submount, and a via in the submount may be registered with the thermally conductive element. In certain embodiments, subassemblies are provided between LED chips and lead frames to improve electrical and thermal coupling. In certain embodiments, underfill materials are arranged between LED chips and lead frames to provide improved mechanical support. According to the embodiments disclosed herein, LED packages are provided with thermal capabilities that allow operation at higher powers with increased power densities.

An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, un-doped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light transmissive optical properties.

Different embodiments of the active LED structure can emit different wavelengths of light depending on the composition of the active layer and n-type and p-type layers. In some embodiments, the active LED structure emits blue light with a peak wavelength range of approximately 430 nanometers (nm) to 480 nm. In other embodiments, the active LED structure emits green light with a peak wavelength range of 500 nm to 570 nm. In other embodiments, the active LED structure emits red light with a peak wavelength range of 600 nm to 650 nm.

The LED chip can also be covered with one or more lumiphoric or other conversion materials, such as phosphors, such that at least some of the light from the LED chip is absorbed by the one or more phosphors and is converted to one or more different wavelength spectra according to the characteristic emission from the one or more phosphors. In some embodiments, the combination of the LED chip and the one or more phosphors emits a generally white combination of light. The one or more phosphors may include yellow (e.g., YAG:Ce), green (e.g., LuAg:Ce), and red (e.g., $Ca_{i-x-y}Sr_xEu_yAlSiN_3$) emitting phosphors, and combinations thereof. Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. In some embodiments, one or more phosphors may include yellow phosphor (e.g., YAG:Ce), green phosphor (e.g., LuAg:Ce), and red phosphor (e.g., $Ca_{i-x-y}Sr_xEu_y$-$AlSiN_3$) and combinations thereof. One or more lumiphoric materials may be provided on one or more portions of an LED chip and/or a submount in various configurations. In certain embodiments, one or more surfaces of LED chips may be conformally coated with one or more lumiphoric materials, while other surfaces of such LED chips and/or associated submounts may be devoid of lumiphoric material. In certain embodiments, a top surface of an LED chip may include lumiphoric material, while one or more side surfaces of an LED chip may be devoid of lumiphoric material. In certain embodiments, all or substantially all outer surfaces of an LED chip (e.g., other than contact-defining or mounting surfaces) are coated or otherwise covered with one or more lumiphoric materials. In certain embodiments, one or more lumiphoric materials may be arranged on or over one or more surfaces of an LED chip in a substantially uniform manner. In other embodiments, one or more lumiphoric materials may be arranged on or over one or more surfaces of an LED chip in a manner that is non-uniform with respect to one or more of material composition, concentration, and thickness. In certain embodiments, the loading percentage of one or more lumiphoric materials may be varied on or among one or more outer surfaces of an LED chip. In certain embodiments, one or more lumiphoric materials may be patterned on portions of one or more surfaces of an LED chip to include one or more stripes, dots, curves, or polygonal shapes. In certain embodiments, multiple lumiphoric materials may be arranged in different discrete regions or discrete layers on or over an LED chip.

Light emitted by the active layer or region of an LED chip is typically omnidirectional in character. For directional applications, internal mirrors or external reflective surfaces may be employed to redirect as much light as possible toward a desired emission direction. Internal mirrors may include single or multiple layers. Some multi-layer mirrors include a metal reflector layer and a dielectric reflector layer, wherein the dielectric reflector layer is arranged between the metal reflector layer and a plurality of semiconductor layers. A passivation layer is arranged between the metal reflector layer and first and second electrical contacts, wherein the first electrical contact is arranged in conductive electrical communication with a first semiconductor layer, and the second electrical contact is arranged in conductive electrical communication with a second semiconductor layer. For single or multi-layer mirrors including surfaces exhibiting less than 100% reflectivity, some light may be absorbed by the mirror. Additionally, light that is redirected through the active LED structure may be absorbed by other layers or elements within the LED chip.

As used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of ultraviolet (UV) LEDs, appropriate materials may be selected to provide a desired, and in some embodiments high, reflectivity and/or a desired, and in some embodiments low, absorption.

The present disclosure can be useful for LED chips having a variety of geometries, such as vertical geometry or lateral geometry. A vertical geometry LED chip typically includes anode and cathode connections on opposing sides or faces of the LED chip. A lateral geometry LED chip typically includes both anode and cathode connections on the same side of the LED chip that is opposite a substrate, such as a growth substrate. In some embodiments, a lateral geometry LED chip may be mounted on a submount of an LED package such that the anode and cathode connections are on a face of the LED chip that is opposite the submount. In this configuration, wirebonds may be used to provide electrical connections with the anode and cathode connections. In other embodiments, a lateral geometry LED chip may be flip-chip mounted on a surface of a submount of an LED package such that the anode and cathode connections are on a face of the active LED structure that is adjacent to the submount. In this configuration, electrical traces or patterns may be provided on the submount for providing electrical connections to the anode and cathode connections of the LED chip. In a flip-chip configuration, the active LED structure is configured between the substrate of the LED chip and the submount for the LED package. Accordingly, light emitted from the active LED structure may pass through the substrate in a desired emission direction. In some embodiments, the flip-chip LED chip may be configured as described in commonly-assigned U.S. Publication No. 2017/0098746, which is hereby incorporated by reference herein. In some embodiments, an LED package may be configured as set forth in the following commonly-assigned U.S. patents and U.S. publications, which are hereby incorporated by reference herein: U.S. Pat. Nos. 8,866,169; 9,070,850; 9,887,327; and U.S. Publication No. 2015/0179903.

FIG. 1 is a cross-sectional view of a representative LED package 10 that includes an LED chip 12. The LED chip 12 includes a primary light emitting face 14 that is opposite a mounting face 16. The LED chip 12 is mounted to a submount 18 such that the mounting face 16 is arranged between the primary light emitting face 14 and the submount 18. The submount 18 can be formed of many different materials, with a preferred material being electrically insulating. Suitable materials include, but are not limited to, ceramic materials such as aluminum oxide or alumina, AlN, or organic insulators like polyimide (PI) and polyphthalamide (PPA). In other embodiments the submount 18 can comprise a printed circuit board (PCB), sapphire, Si, or any other suitable material. For PCB embodiments, different PCB types can be used such as standard FR-4 PCBs, metal core PCBs, or any other type of PCB. LED packages according to the present disclosure can be fabricated using a method that utilizes a submount panel sized to accommodate a plurality of submounts. Multiple LED packages can be formed on the panel, with individual packages being singulated from the panel. The LED chip 12 can be mounted to the submount 18 using known methods and material mounting such as using conventional solder materials that may or may not contain a flux material or dispensed polymeric materials that may be thermally and electrically conductive, as well as other methods and material mounting such as solderless, direct attach, or other conventional attachment means.

The LED package 10 further includes an encapsulant 20 that may provide both environmental and/or mechanical protection for the LED chip 12. The encapsulant 20 may also be referred to as an encapsulant layer. Many different materials can be used for the encapsulant 20, including silicones, plastics, epoxies or glass, with a suitable material being compatible with molding processes. Silicone is suitable for molding and provides suitable optical transmission properties for light emitted from the LED chip 12. In some embodiments, the encapsulant 20 can be molded into the shape of a lens 20'. Different molding techniques may provide the lens 20' with many different shapes depending on the desired emission pattern for the LED package 10. One suitable shape as shown in FIG. 1 is hemispheric, with some examples of alternative shapes being ellipsoid bullet, flat, hex-shaped and square. In certain embodiments, a suitable shape includes both curved and planar surfaces, such as a hemispheric top portion with planar side surfaces. It is understood that the encapsulant 20 can also be textured to improve light extraction. In some embodiments, a portion of the encapsulant 20 may form a protective layer that covers any portion of the submount 18 that is not covered by the shape of the lens 20'. For example, in FIG. 1, where the hemispherical shape of the lens 20' ends, a planar extension of encapsulant 20 material may be provided from the lens 20' to one or more perimeter edges of the submount 18 to provide additional protection to elements on the top surface to reduce damage and contamination during subsequent processing steps and use. In certain embodiments, the encapsulant 20 may include one or more lumiphoric materials or scattering particles. In other embodiments, one or more lumiphoric materials may be provided in a separate layer or layers between the LED chip 12 and the encapsulant 20.

As illustrated in FIG. 1, the LED chip 12 is arranged on the submount 18 in a flip-chip configuration in certain embodiments. In this regard, the LED chip 12 includes a first contact pad 22 and a second contact pad 24 on the mounting face 16 that are configured to be mounted and electrically and thermally coupled to a first die attach pad 26 and a second die attach pad 28, respectively, that are arranged on the submount 18. In certain embodiments, the first contact pad 22 and the second contact pad 24 comprise a thickness of in a range of about 1 micron ($\mu$m) to about 8 $\mu$m, or in range of about 3 $\mu$m to about 5 $\mu$m. The first contact pad 22 and the second contact pad 24 may comprise different ones of an anode contact pad and a cathode contact pad for the LED chip 12. In certain embodiments, the first die attach pad 26 and the second die attach pad 28 comprise a thickness in a range of about 1 $\mu$m to about 100 $\mu$m, or in a range of about 5 $\mu$m to about 90 $\mu$m, or in a range of about 40 $\mu$m to about 80 $\mu$m. The first die attach pad 26 and the second die attach pad 28 are arranged on a first face 30 of the submount 18 that also may support the encapsulant 20. The submount 18 includes a second face 32 that generally opposes the first face 30. In certain embodiments, the second face 32 of the submount 18 includes a first package bond pad 34 and a second package bond pad 36 that are configured to receive an external electrical connection for the LED package 10. For example, the LED package 10 may be mounted on another board that includes electrical traces or leads that correspond with the package bond pads 34, 36.

In order to electrically couple the package bond pads 34, 36 with the LED chip 12, the submount 18 comprises one or more vias 38 of electrically conductive material that extend between the first face 30 and the second face 32 of the submount 18. In particular, the vias 38 may be configured to be electrically and thermally coupled with the die attach pads 26, 28 and the package bond pads 34, 36. In certain embodiments, the vias 38 extend completely through the submount 18 to provide electrical connections between the package bond pads 34, 36 and the die attach pads 26, 28. In typical manufacturing processes, the vias 38 may be formed by punching, cutting, drilling, laser cutting, or laser drilling of holes in the submount 18, followed by plating or filling the holes with a conductive material such as copper or aluminum, among others. In certain embodiments, the vias 38 may comprise a cross-sectional diameter in a range of about 20 $\mu$m to about 200 $\mu$m, or in a range of about 50 $\mu$m to about 160 $\mu$m, or in a range of about 80 $\mu$m to about 120 $\mu$m. Due to various manufacturing tolerances, the conductive material may include gaps or voids that can trap gas within the vias 38. During subsequent assembly steps for the LED package 10, the vias 38 can be exposed to increased temperatures, such as those experienced during bonding or curing steps. Increased temperatures can cause some vias 38, particularly those with the gaps or voids, to expand and push up or protrude from the submount 18, thereby forming what may be referred to as blistered vias. As illustrated in FIG. 1, each via 38 includes at least a via portion 38' that protrudes out of the first face 30 and through the die attach pads 26, 28. These protruding via portions 38' can provide uneven surfaces for the LED chip 12 to be mounted on. In this regard, the protruding via portions 38' may prevent the contact pads 22, 24 of the LED chip 12 from making good bonds with the die attach pads 26, 28 of the submount 18, thereby providing poor thermal and electrical coupling between the LED chip 12 and the submount 18. Additionally, gaps between the contact pads 22, 24 and the die attach pads 26, 28 may allow material of the encapsulant 20, e.g. silicone, to form between the contact pads 22, 24 and the die attach pads 26, 28. The material of the encapsulant 20 may expand during subsequent thermal cycling and can lead to the LED chip 12 separating or popping off of the submount 18.

According to embodiments disclosed herein, an LED package may include one or more features configured to provide improved thermal and/or electrical coupling between LED chips and submounts. In certain embodiments, LED packages may be configured with one or more openings (e.g., recesses or apertures) that are registered with vias in submounts in a manner that allows the vias to expand without degrading thermal or electrical coupling. Accordingly, LED packages are provided with thermal capabilities that allow operation at higher powers with increased power densities. In certain embodiments, an LED package includes a submount comprising a first face and a second face that opposes the first face. The submount may further comprise a via that extends between the first face and the second face, and a die attach pad that is on the first face and registered with the via. An LED chip may comprise a contact pad that is coupled with the die attach pad, and the contact pad comprises an opening that is registered with the via. In this manner, the via may expand into the opening without degrading thermal or electrical coupling between the contact pad of the LED chip and the die attach pad of the submount.

Figure 2A:
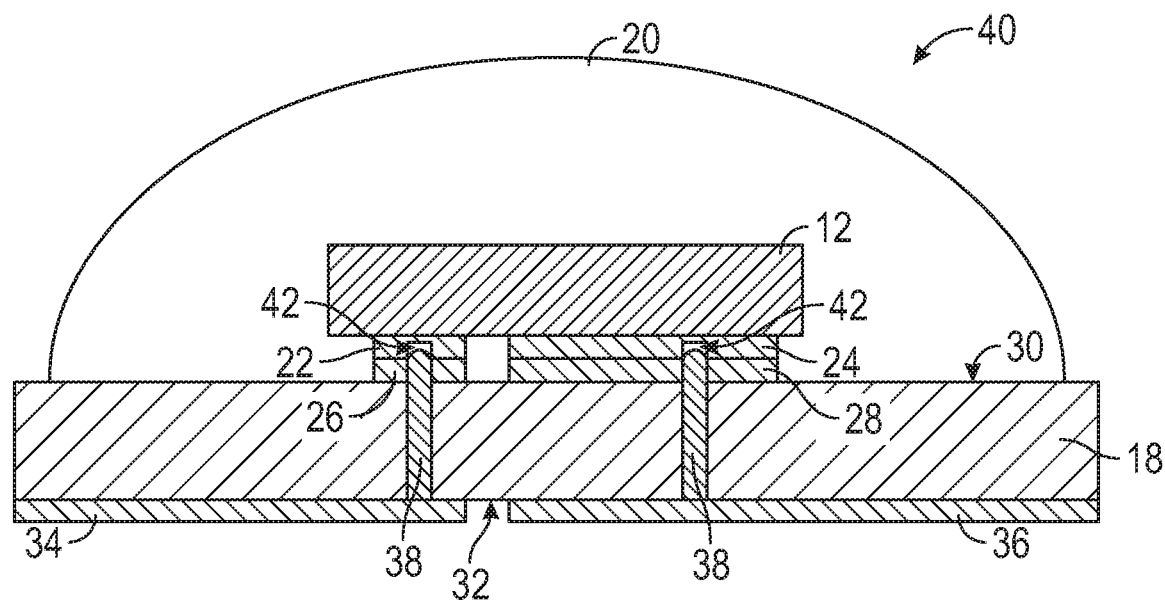
FIG. 2A is a cross-sectional view of an LED package that includes one or more openings that are registered with vias according to embodiments disclosed herein.

FIG. 2A is a cross-sectional view of an LED package 40 that includes one or more openings 42 that are registered with vias 38 according to embodiments disclosed herein. The LED package 40 includes the LED chip 12 with the contact pads 22, 24 coupled with the die attach pads 26, 28 of the submount 18 as previously described. The LED package 40 may further include the encapsulant 20, the one or more vias 38 that extend between the first face 30 and the second face 32 of the submount 18, and the package bond pads 34, 36 as previously described. As illustrated in FIG. 2A, the contact pads 22, 24 include the openings 42 that are registered with the vias 38. In this manner, when the LED chip 12 is mounted to the submount 18, the vias 38 have room to expand within the openings 42 without compromising thermal or electrical coupling between the contact pads 22, 24 and the die attach pads 26, 28. The openings 42 may be formed in the contact pads 22, 24 by selectively removing portions of the contact pads 22, 24 after they have been formed. Alternatively, the openings 42 may be formed concurrently with the contact pads 22, 24 by way of selective deposition, such as deposition through a patterned mask. In certain embodiments, the openings 42 embody recesses that extend through less than an entire thickness of the contact pads 22, 24, with each opening having a maximum depth smaller than a thickness of the corresponding contact pad 22, 24. In other embodiments, the openings 42 may embody apertures that extend through an entire thickness of the contact pads 22, 24. The openings 42 may be configured to have a same size or a larger size than a maximum width or diameter of the vias 38. In certain embodiments, the openings 42 may comprise a similar cross-sectional shape as the vias 38, such as circles, ovals, squares, or rectangles, among others. In other embodiments, the openings 42 may comprise cross-sectional shapes that are different than the vias 38, such as larger square or rectangular shaped openings 42 that are registered with circular vias 38.

Figure 2B:
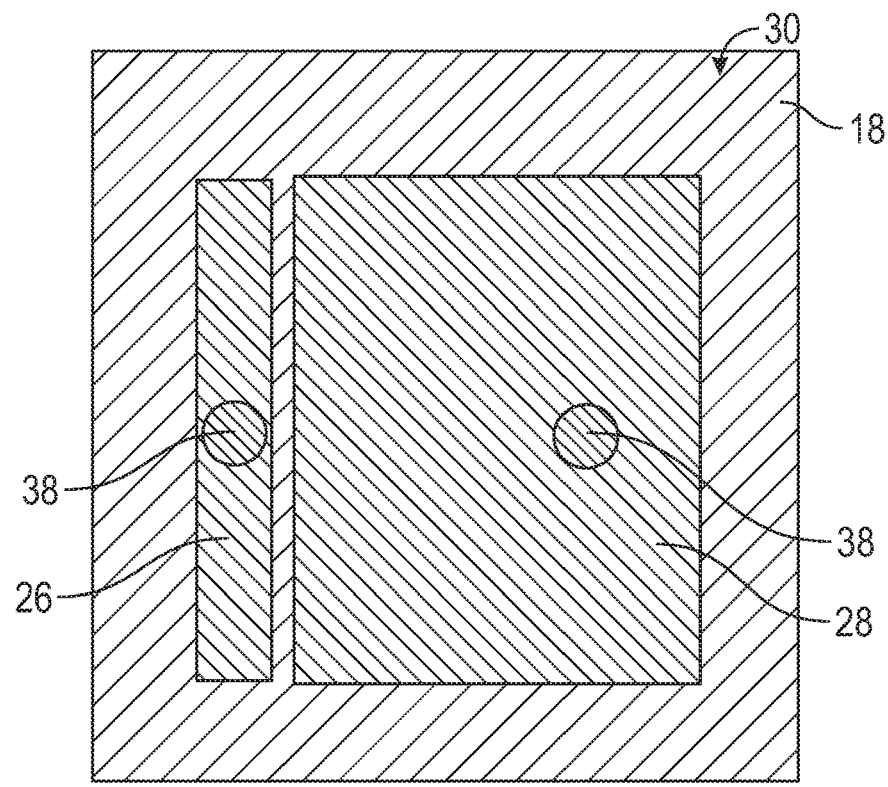
FIG. 2B is a top view of a portion of the first face of the submount of FIG. 2A.
Figure 2C:
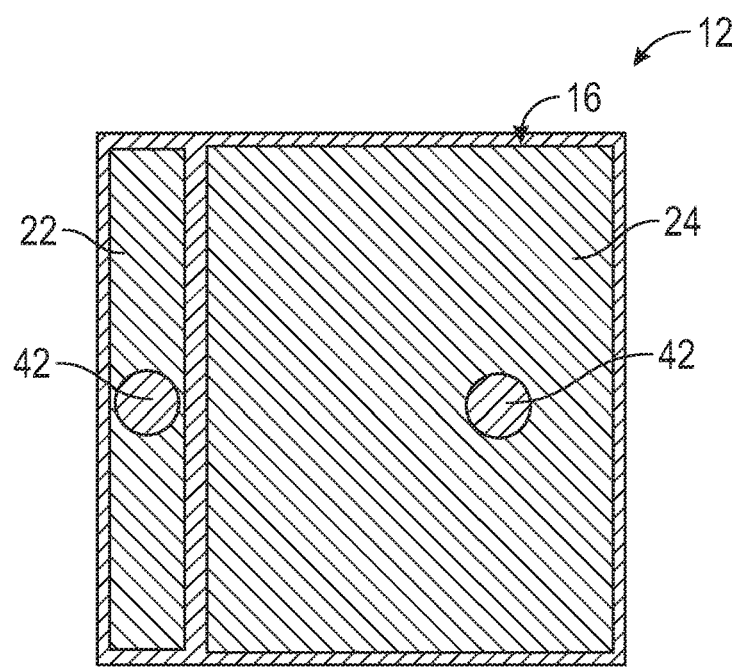
FIG. 2C is a bottom view of the mounting face of the LED chip of FIG. 2A.

FIG. 2B is a top view of a portion of the first face 30 of the submount 18 of FIG. 2A. As illustrated, the submount 18 includes the first die attach pad 26 that is registered with one of the vias 38 and a second die attach pad 28 that is registered with a different one of the vias 38. FIG. 2C is a bottom view of the mounting face 16 of the LED chip 12 of FIG. 2A. The first die attach pad 26 and the second die attach pad 28 collectively form a die attach area for the LED chip 12. In particular, the first contact pad 22 of the LED chip 12 is configured for mounting with the first die attach pad 26 of the submount 18, and the second contact pad 24 of the LED chip 12 is configured for mounting with the second die attach pad 28 of the submount 18. The contact pads 22, 24 include the openings 42 as previously described. The openings 42 are configured to be registered or aligned with the vias 38 of the submount 18 when the LED chip 12 is mounted on the submount 18. In certain embodiments, the LED chip 12 may include different numbers of contact pads. For example, the LED chip 12 may include a single contact pad that is registered with a single die attach pad on the submount 18.

According to embodiments disclosed herein, an LED package may include multiple LED chips or a multiple-junction LED chip mounted to a common submount. The multiple LED chips or the multiple-junction LED chip may include contact pads with openings that are registered with vias in the submount. In particular, each LED chip or each LED junction of a multiple-junction LED chip may include a separate contact pad that comprises an opening that is registered with a different via of the submount.

Figure 3A:
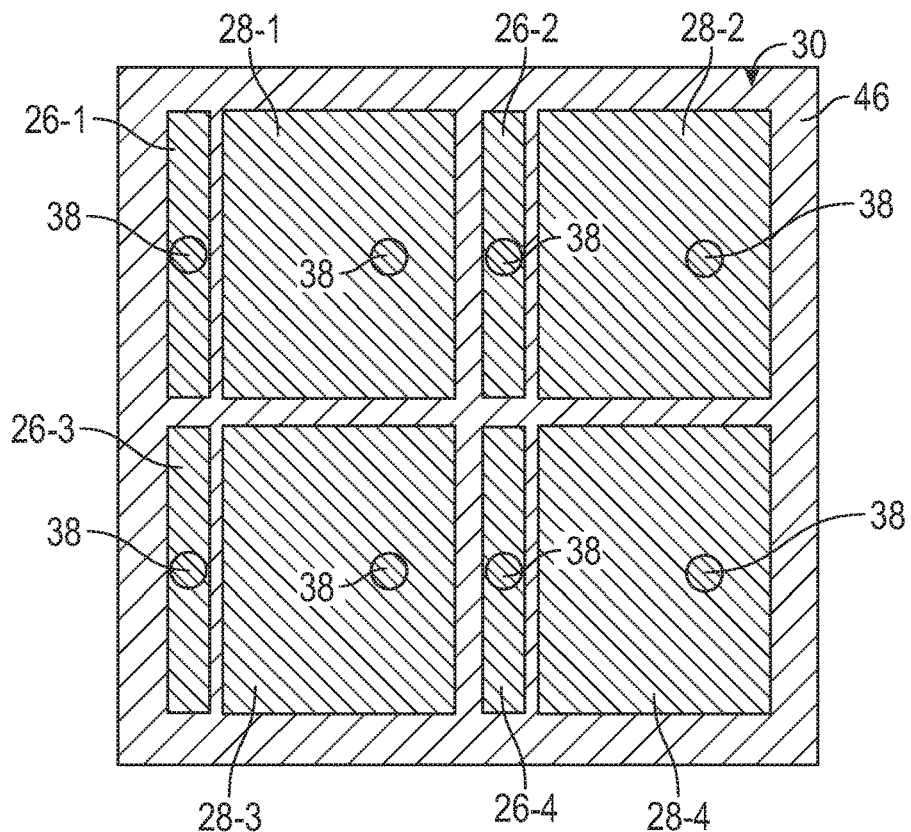
FIG. 3A is a top view of a portion of the first face of a submount that is configured for multiple LED chips or a multiple-junction LED chip.
Figure 3B:
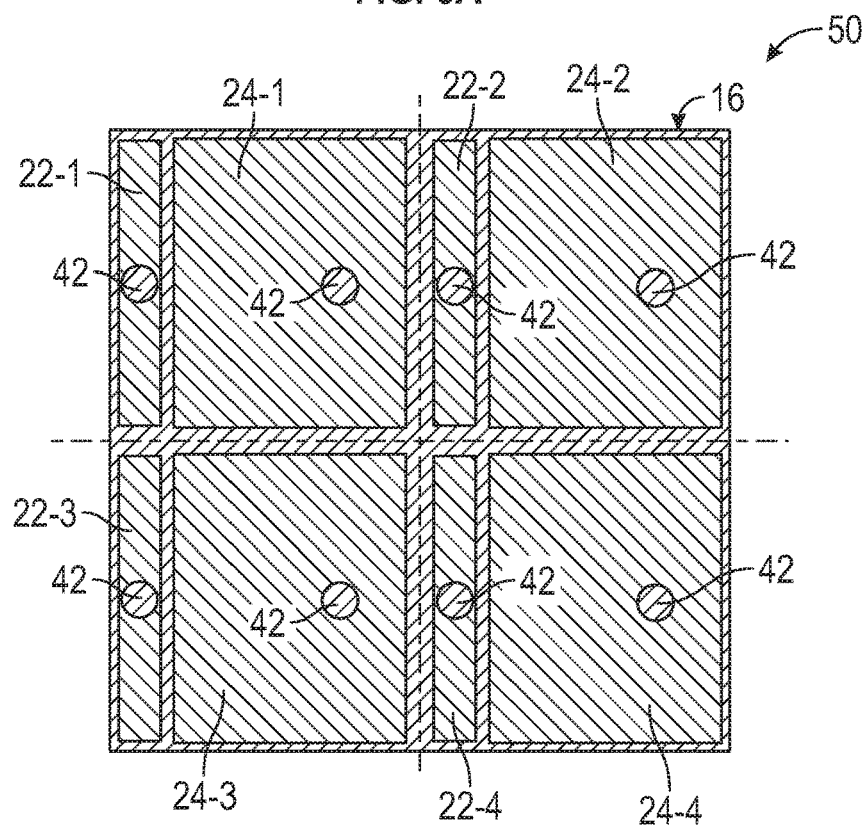
FIG. 3B is a bottom view of the mounting face of a multiple-junction LED chip that is configured to be mounted on the submount of FIG. 3A.

FIG. 3A is a top view of a portion of the first face 30 of a submount 46 that is configured for multiple LED chips or a multiple-junction LED chip. As illustrated, the submount 46 includes a plurality of first die attach pads 26-1 to 26-4 and a plurality of second die attach pads 28-1 to 28-4. At least one via of the plurality of vias 38 may be registered with each of the first die attach pads 26-1 to 26-4 and each of the second die attach pads 28-1 to 28-4. Individual pairs of the first and second die attach pads 26-1 to 26-4, 28-1 to 28-4 (e.g., a first pair formed by the first die attach pad 26-1 and the second die attach pad 28-1) collectively form separate die attach areas for multiple LED chips or a multiple-junction LED chip. FIG. 3B is a bottom view of the mounting face 16 of a multiple-junction LED chip 50 that is configured to be mounted on the submount 46 of FIG. 3A. The mounting face 16 includes a plurality of first contact pads 22-1 to 22-4 and a plurality of second contact pads 24-1 to 24-4. Each pair of first and second contact pads 22-1 to 22-4, 24-1 to 24-4 (e.g., a first pair formed by the first contact pad 22-1 and the second contact pad 24-1) is arranged to be electrically coupled with a different junction of the multiple-junction LED chip 50. Different junctions may be formed by isolating separate active layers or active layer regions of the multiple-junction LED chip 50. The openings 42 are configured as previously described to be registered or aligned with the vias 38 of the submount 46. In other embodiments, multiple LED chips can be individually mounted on the submount 46 of FIG. 3A. Multiple LED chips may have similar structures as described for the multiple-junction LED chip 50, but with separate LED chips formed along the dashed lines of FIG. 3B. In certain embodiments, each LED chip of a plurality of LED chips comprises a separate contact pad with an opening 42 that is registered with a different via 38 of the submount 46.

According to embodiments disclosed herein, an LED package may include a submount with multiple vias configured in arrangements that allow improved mounting surfaces for LED chips. In certain embodiments, a submount for an LED package comprises vias configured in a triangular arrangement. In particular, a submount may include three vias in a triangular arrangement. As previously described, vias can sometimes expand and protrude from a surface of a submount, thereby creating uneven mounting surfaces for LED chips. By having three vias in a triangular arrangement, the vias will form an arbitrary plane such that the LED chip may be evenly supported by the three vias, regardless of any protruding height differences between the vias.

Figure 4A:
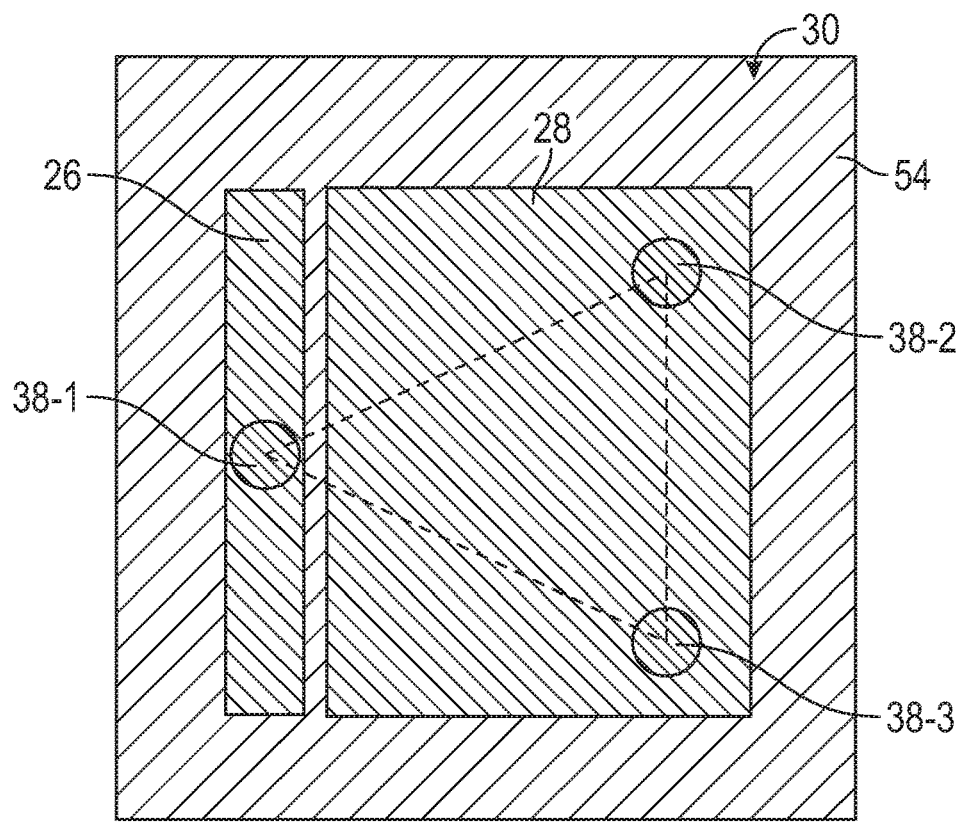
FIG. 4A is a top view of a portion of the first face of a submount that includes vias configured in a triangular arrangement.
Figure 4B:
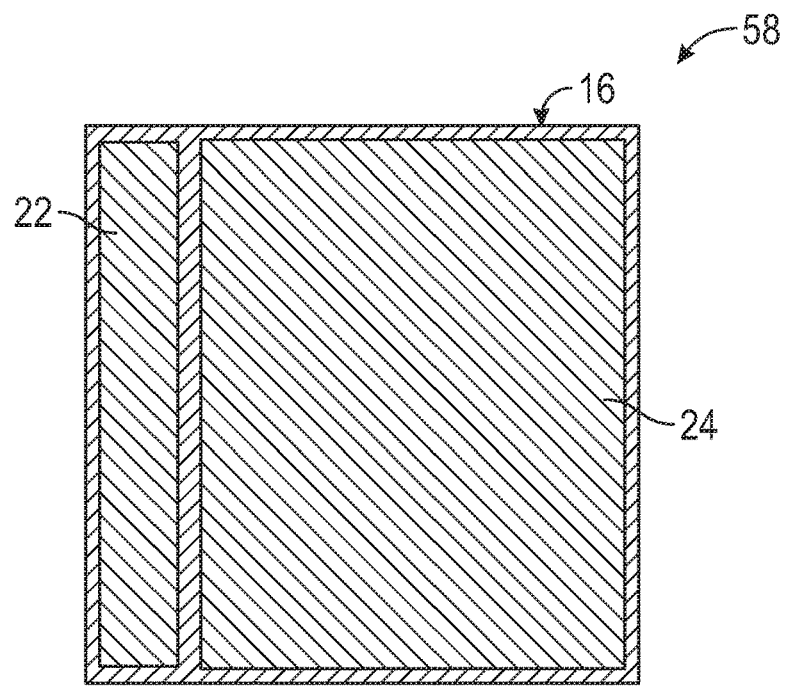
FIG. 4B is a bottom view of the mounting face of an LED chip that is configured to be mounted on the submount of FIG. 4A.

FIG. 4A is a top view of a portion of the first face 30 of a submount 54 that includes a plurality of vias 38-1 to 38-3 arranged in the submount 54 as previously described and configured in a triangular arrangement (as indicated by the dashed lines in FIG. 4A). In FIG. 4A, one via 38-1 is registered with the first die attach pad 26, and the other vias 38-2, 38-3 are registered with the second die attach pad 28. In other embodiments, the order may be reversed such that two vias 38-2, 38-3 are registered with the first die attach pad 26 and the one via 38-1 is registered with the second die attach pad 28. In still other embodiments, the submount 54 may include a single die attach pad for receiving an LED chip and the single die attach pad may be registered with the plurality of vias 38-1 to 38-3. As illustrated in FIG. 4A, three vias 38-1 to 38-3 are positioned relative to one another in the submount 54 to form vertices of a triangle. FIG. 4B is a bottom view of the mounting face 16 of an LED chip 58 that is configured to be mounted on the submount 54 of FIG. 4A. As illustrated, the first contact pad 22 and the second contact pad 24 do not have the openings 42 as previously described. In this manner, the first contact pad 22 and the second contact pad 24 form a generally planar surface that is configured to be mounted on the submount 54 of FIG. 4A. If any of the vias 38-1 to 38-3 protrude to different heights above the submount 54, the generally planar surface formed by the first contact pad 22 and the second contact pad 24 will self-level across the triangular plane formed by the heights of the three vias 38-1 to 38-3. In certain embodiments, the first contact pad 22 and the second contact pad 24 may further comprise openings that are registered with the vias 38-1 to 38-3 as previously described.

According to certain embodiments disclosed herein, an LED package may include a plurality of vias in a submount that are registered between a particular die attach pad and a particular package bond pad. In certain embodiments, the plurality of vias are electrically and thermally coupled between the particular die attach pad and the particular package bond pad to form a plurality of electrically and thermally conductive paths. Additionally, the plurality of vias may be arranged in close proximity to one another and, accordingly, the vias will experience similar manufacturing conditions. In this manner, if the plurality of vias protrude out of the submount as previously described, the vias may protrude with similar heights, thereby reducing unevenness with an LED chip after mounting.

Figure 5A:
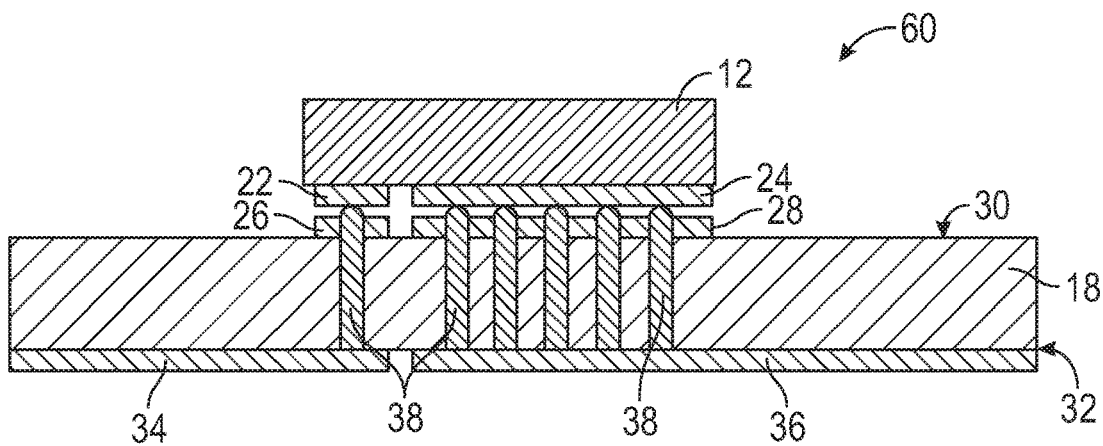
FIG. 5A is a cross-sectional view of an LED package that includes a plurality of vias arranged between particular die attach pads and package bond pads according to embodiments disclosed herein.
Figure 5B:
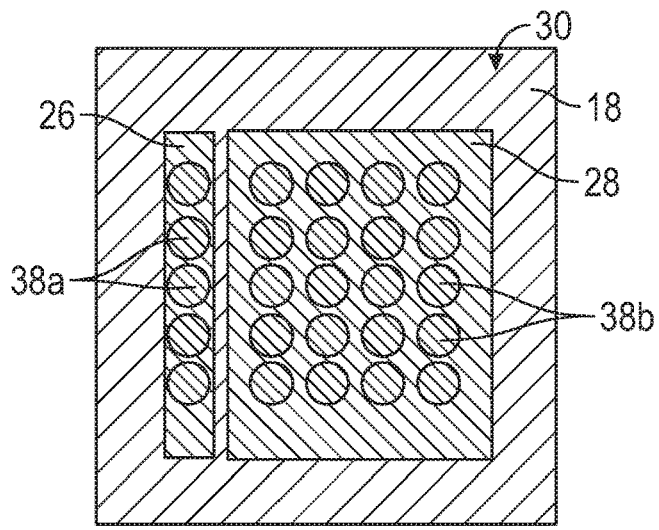
FIG. 5B is a top view of a portion of the first face of the submount of FIG. 5A.
Figure 5C:
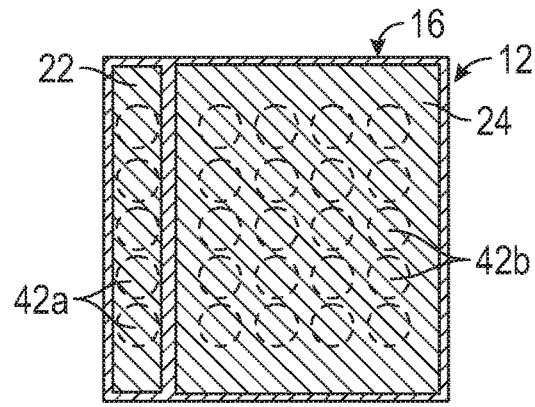
FIG. 5C is a bottom view of the mounting face of the LED chip of FIG. 5A.

FIG. 5A is a cross-sectional view of an LED package 60 that includes a plurality of vias 38 arranged between particular die attach pads and package bond pads according to embodiments disclosed herein. The LED package 60 includes the LED chip 12 with the contact pads 22, 24 mounted on the submount 18 with the die attach pads 26, 28 and the package bond pads 34, 36 as previously described. The encapsulant (20 of FIG. 2A) may also be provided on the LED chip 12 and the submount 18 as previously described. The submount 18 further includes the plurality of vias 38 that extend between the first face 30 and the second face 32 of the submount 18. Notably, an increased amount of vias 38 are provided between the second die attach pad 28 and the second package bond pad 36. In this regard, the vias 38 between the second contact pad 24 and the second package bond pad 36 may be in close proximity to one another and may experience similar manufacturing conditions. Accordingly, if any of the vias 38 expand or protrude from the first face 30, the likelihood is that all of the vias 38 may expand or protrude in a similar manner, thereby providing a more uniform support and contact for the LED chip 12. Additionally, the increased amount of vias 38 also provides additional thermal and electrical paths for the LED chip 12, thereby allowing the LED chip 12 to be operated with higher powers and increased power densities. In certain embodiments, an increased amount of vias 38 may also be arranged between the first contact pad 22 and the first die attach pad 26. FIG. 5B is a top view of a portion of the first face 30 of the submount 18 of FIG. 5A. As illustrated, a first plurality of vias 38a are registered with the first die attach pad 26 and a second plurality of vias 38b are registered with the second die attach pad 28. In certain embodiments, the second plurality of vias 38b are arranged with a shape that is the same or similar to the second die attach pad 28. For example, in FIG. 5B, the second die attach pad 28 is configured as a rectangular polygonal shape and outermost vias 38b of the second plurality of vias 38b are arranged to form vertices of a rectangular polygonal shape. In this regard, uniform support for the LED chip (12 of FIG. 5A) may be provided across the second die attach pad 28. FIG. 5C is a bottom view of the mounting face 16 of the LED chip 12 of FIG. 5A. As with previous embodiments, the first contact pad 22 of the LED chip 12 is configured for mounting with the first die attach pad 26 of the submount 18, and the second contact pad 24 of the LED chip 12 is configured for mounting with the second die attach pad 28 of the submount 18. In certain embodiments, the first contact pad 22 and the second contact pad 24 form a generally planar surface that can be evenly mounted over the submount 18. In other embodiments, the contact pads 22, 24 may include a first plurality of openings 42a and a second plurality of openings 42b, respectively, as previously described and indicated by dashed lines in FIG. 5C. In certain embodiments, the openings 42a, 42b are configured to be registered or aligned respectively with the vias 38a, 38b of the submount 18 when the LED chip 12 is mounted on the submount 18.

Figure 5D:
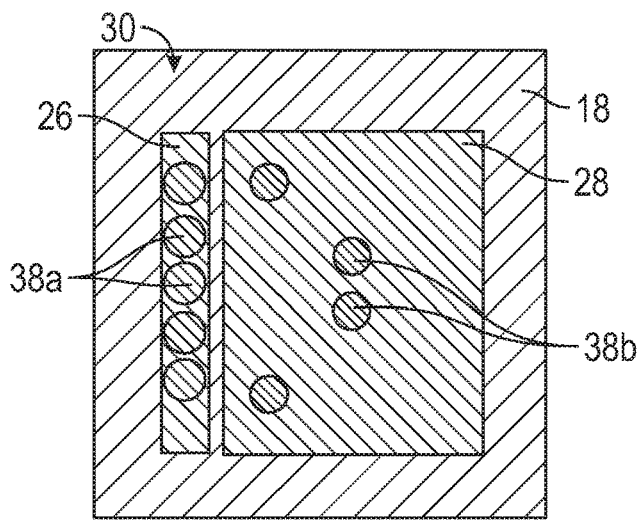
FIG. 5D is a top view of a portion of the first face of the submount of FIG. 5A with a different arrangement of vias.
Figure 5E:
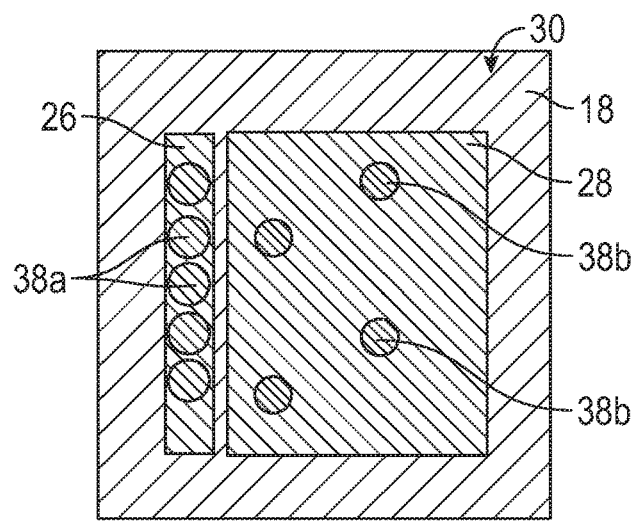
FIG. 5E is a top view of a portion of the first face of the submount of FIG. 5A with a different arrangement of vias.
Figure 5F:
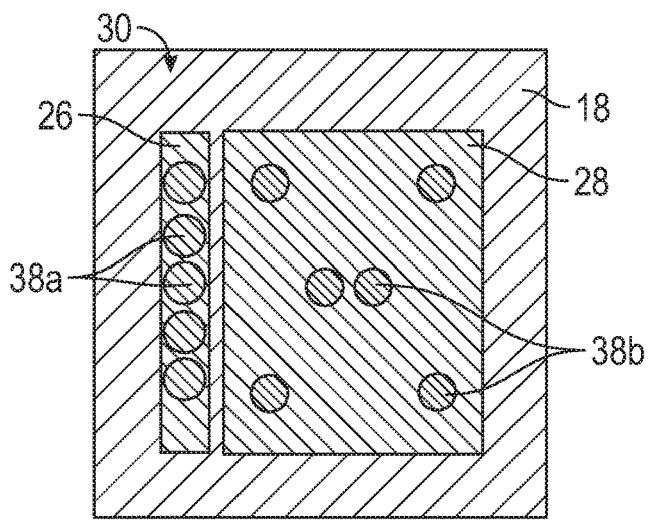
FIG. 5F is a top view of a portion of the first face of the submount of FIG. 5A with a different arrangement of vias.

FIGS. 5D and 5E are various top views of a portion of the first face 30 of the submount 18 of FIG. 5A with different arrangements of the second plurality of vias 38b that are registered with the second die attach pad 28. As illustrated, the first plurality of vias 38a are registered with the first die attach pad 26 as previously described. In certain embodiments, outermost vias 38b of the second plurality of vias 38b are arranged to form vertices of a non-rectangular polygonal shape. In FIG. 5D, outermost vias 38b of the second plurality of vias 38b are arranged to form vertices of a trapezoidal shape. In FIG. 5E, outermost vias 38b of the second plurality of vias 38b are arranged to form vertices of a parallelogram. While trapezoid and parallelogram shapes are illustrated in FIGS. 5D and 5E, outermost vias 38b of the second plurality of vias 38b may form other non-rectangular shapes. In this regard, the second plurality of vias 38b may be arranged with non-rectangular polygonal shapes to provide various mounting planes for the LED chip (12 of FIG. 5A). In certain embodiments, the outermost vias 38b of the second plurality of vias 38b comprise three vias that are positioned relative to one another in the submount 18 to form vertices of a triangle. In certain embodiments, the second plurality of vias 38b may be arranged in an asymmetric pattern. As previously described, the second plurality of vias 38b may be configured to provide electrical coupling and/or thermal coupling between the second die attach pad 28 and the second package bond pad (36 of FIG. 5A). As shown in FIG. 5F, spacing between adjacent vias 38b of the second plurality of vias 38b is smaller near the center of the second die attach pad 28 than along a perimeter of the die attach pad 28. The smaller spacing of the adjacent vias 38b of the second plurality of vias 38b may provide localized areas with increased thermal dissipation capabilities. In FIG. 5F, the smaller spacing is provided near the center of the second die attach pad 28, where heat may tend to concentrate in higher amounts during operation. Depending on the particular application and heat profile of a particular LED package, smaller spacing between adjacent vias 38b of the second plurality of vias 38b may be arranged in other locations, such as along the perimeter of the second die attach pad 28, or an array of closely spaced via clusters arranged across the second die attach pad 28.

According to certain embodiments disclosed herein, an LED package may include a submount with vias configured in arrangements that provide improved thermal dissipation for LED chips. In certain embodiments, at least some of the vias may be electrically isolated from LED chips mounted on the submount. In this regard, electrical connections may be provided to the LED chips by other arrangements, such as wire bonds or other die attach pads that have electrically coupled vias. The electrically isolated vias may be provided in the submount in areas that experience high amounts of heat during operation, such as below an LED chip mounted thereon. The vias may be arranged to extend less than an entire distance through the submount. The vias may be arranged perpendicular to a first face of the submount, or the vias may be arranged at oblique angles within the submount to dissipate heat in more lateral directions. In certain embodiments, a second submount may be arranged between an LED chip and a first submount that includes a plurality of vias.

Figure 6:
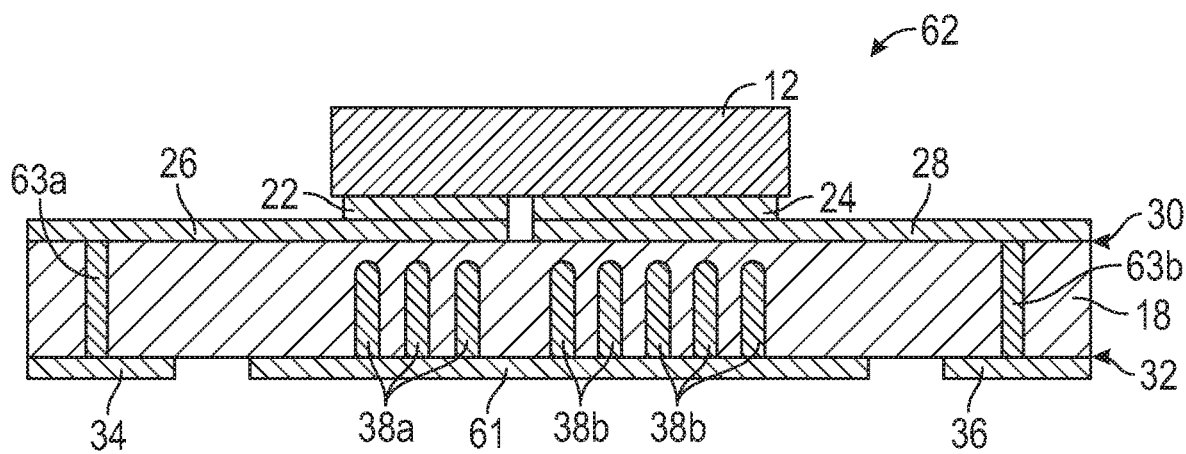
FIG. 6 is a cross-sectional view of an LED package that includes a plurality of vias arranged in a submount according to embodiments disclosed herein.

FIG. 6 is a cross-sectional view of an LED package 62 that includes a plurality of vias 38a, 38b arranged in the submount 18 according to embodiments disclosed herein. The LED package 62 includes the LED chip 12 with the contact pads 22, 24 mounted on the submount 18 with the die attach pads 26, 28 and the package bond pads 34, 36 as previously described. The encapsulant (20 of FIG. 2A) may also be provided on the LED chip 12 and the submount 18 as previously described. The submount 18 further includes a first plurality of vias 38a that are registered with the first die attach pad 26 and a second plurality of vias 38b that are registered with the second die attach pad 28. Notably, the vias 38a, 38b are configured to extend less than an entire distance between the first face 30 and the second face 32 of the submount 18. In certain embodiments, the first plurality of vias 38a and the second plurality of vias 38b are electrically isolated from the first die attach pad 26 and the second die attach pad 28. In this manner, while not electrically coupled to the LED chip 12, the vias 38a, 38b are configured to dissipate heat that radiates into the submount 18 away from the LED chip 12. In particular, the vias 38a, 38b may be configured to dissipate heat through the submount 18 and to a thermal pad 61. The thermal pad 61 may be arranged on the second face 32 of the submount 18. The thermal pad 61 may comprise one or more metal layers, similar to the package bond pads 34, 36. In certain embodiments, the package bond pads 34, 36 are electrically coupled with the die attach pads 26, 28 by way of electrically conductive vias or paths 63a, 63b through the submount 18. The die attach pads 26, 28 may be configured to extend on the first face 30 to lateral edges of the submount 18 to provide increased surface area for thermal dissipation on the first face 30. As illustrated, the vias 38a, 38b are configured in a direction perpendicular to the first face 30 of the submount 18. Accordingly, heat may be dissipated through a shorter path through the submount 18, where in turn, the heat may be dissipated laterally through the thermal pad 61 or into another material on which the LED package 62 may be mounted, such as a fixture housing, a heat sink, or the like.

Figure 7A:
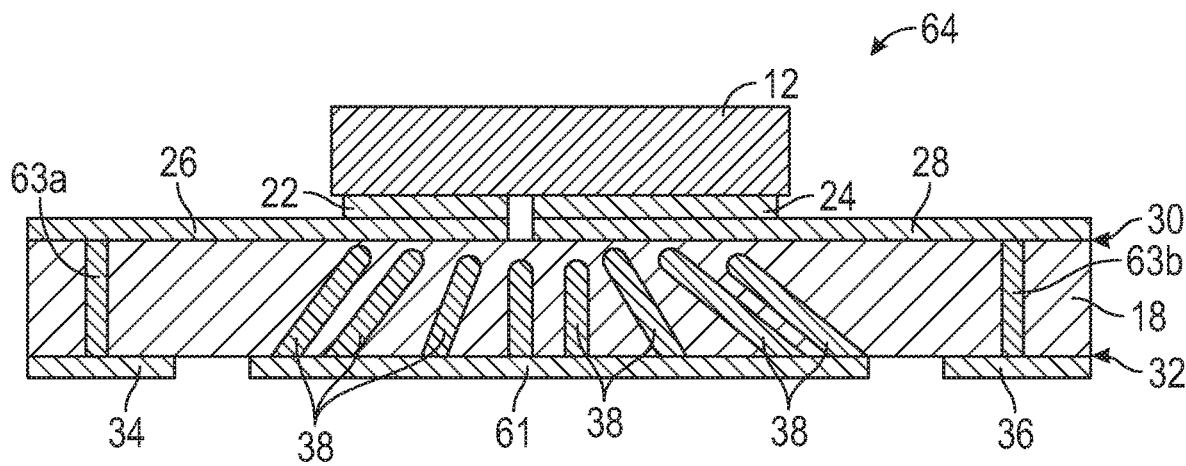
FIG. 7A is a cross-sectional view of an LED package that includes a plurality of vias, at least some of which are arranged at oblique angles within a submount according to embodiments disclosed herein.

FIG. 7A is a cross-sectional view of an LED package 64 that includes a plurality of vias 38, at least some of which are arranged at oblique angles within the submount 18 according to embodiments disclosed herein. The LED package 64 includes the LED chip 12 with the contact pads 22, 24 mounted on the submount 18 with the die attach pads 26, 28, the package bond pads 34, 36, and the electrically conductive vias or paths 63a, 63b as previously described. The encapsulant (20 of FIG. 2A) may also be provided on the LED chip 12 and the submount 18 as previously described. Notably, at least one of the plurality of vias 38 extends in the submount 18 at an oblique angle from the first face 30 to the second face 32. In this manner heat may be dissipated away from the LED chip 12 in multiple directions through the submount 18, including along thermal paths with oblique angles where heat dissipates laterally away from the LED chip 12 as it dissipates through the submount 18. The plurality of vias 38 may be thermally coupled with the thermal pad 61 as previously described. In this regard, heat that may be concentrated directly under the LED chip 12 may be distributed to the thermal pad 61 with increased lateral spreading.

Figure 7B:
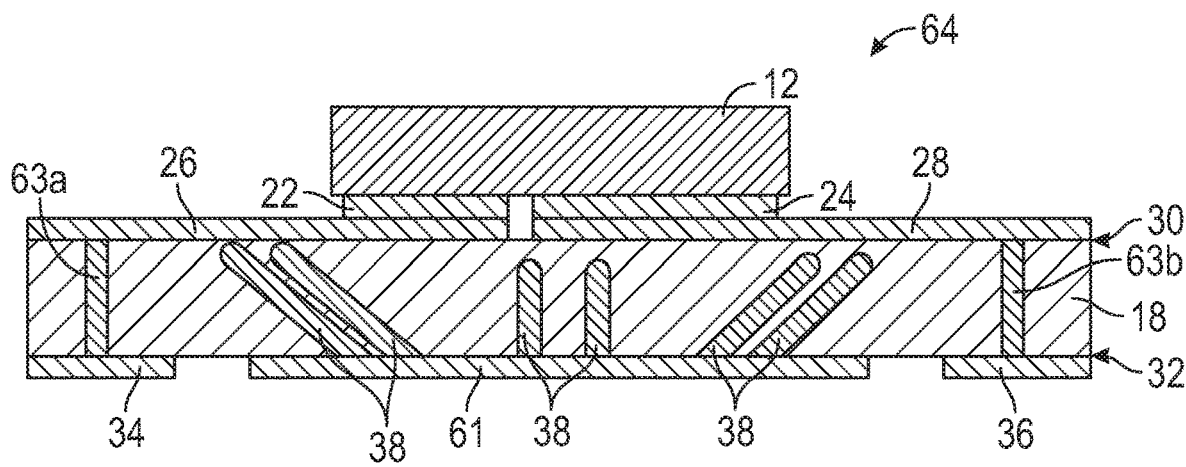
FIG. 7B is a cross-sectional view of the LED package of FIG. 7A where at least some of the plurality of vias are arranged at different oblique angles according to embodiments disclosed herein.

FIG. 7B is a cross-sectional view of the LED package 64 of FIG. 7A where at least some of the plurality of vias 38 are arranged at different oblique angles within the submount 18 according to embodiments disclosed herein. The LED package 64 includes the LED chip 12 with the contact pads 22, 24 mounted on the submount 18 with the die attach pads 26, 28, the package bond pads 34, 36, and the electrically conductive vias or paths 63a, 63b as previously described. The encapsulant (20 of FIG. 2A) may also be provided on the LED chip 12 and the submount 18 as previously described. Notably, at least one of the plurality of vias 38 extends in the submount 18 at an oblique angle from the first face 30 to the second face 32. In this manner heat may be dissipated in multiple directions through the submount 18, including along thermal paths at oblique angles where heat dissipates laterally toward the thermal pad 61 as it dissipates through the submount 18. In this regard, heat that may spread laterally along the first face 30 may be directed through the submount 18 and to the thermal pad 61.

Figure 8:
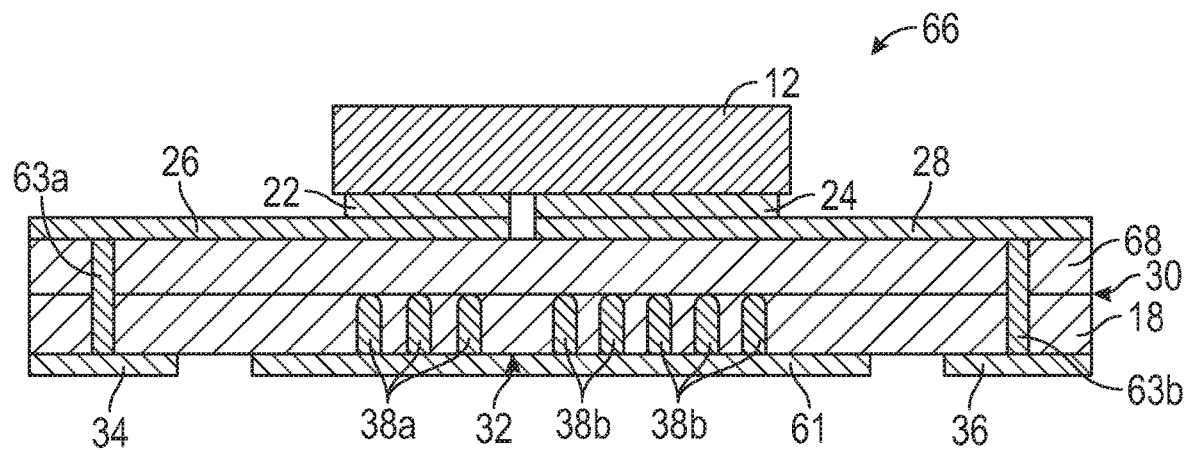
FIG. 8 is a cross-sectional view of an LED package that includes a second submount arranged between an LED chip and a plurality of vias according to embodiments disclosed herein.

FIG. 8 is a cross-sectional view of an LED package 66 that includes a second submount 68 arranged between the LED chip 12 and the plurality of vias 38a, 38b according to embodiments disclosed herein. The LED package 66 includes the LED chip 12 with the contact pads 22, 24 and the submount 18, also referred to as a first submount 18, with the package bond pads 34, 36 as previously described. The encapsulant (20 of FIG. 2A) may also be provided on the LED chip 12 and the second submount 68 as previously described. The second submount 68 is arranged between the LED chip 12 and the first submount 18, and the second submount 68 accordingly includes the die attach pads 26, 28 as previously described. The first submount 18 includes the first plurality of vias 38a that are registered with the first die attach pad 26 and the second plurality of vias 38b that are registered with the second die attach pad 28 as previously described. In certain embodiments, the vias 38a, 38b extend less than an entire distance between the first face 30 and the second face 32 of the first submount 18. In other embodiments, the vias 38a, 38b may extend completely through the first submount 18. Notably, the second submount 68 provides mechanical and electrical isolation between the vias 38a, 38b and the die attach pads 26, 28. In this regard, the die attach pads 26, 28 and the LED chip 12 are buffered from any expanding or protruding of the vias 38a, 38b that may occur. Additionally, the vias 38a, 38b are still configured to dissipate heat from the LED chip 12 to the thermal pad 61. In FIG. 8, the electrically conductive paths 63a, 63b may be arranged through both of the first submount 18 and the second submount 68 between the die attach pads 26, 28 and the package bond pads 34, 36.

Figure 9:
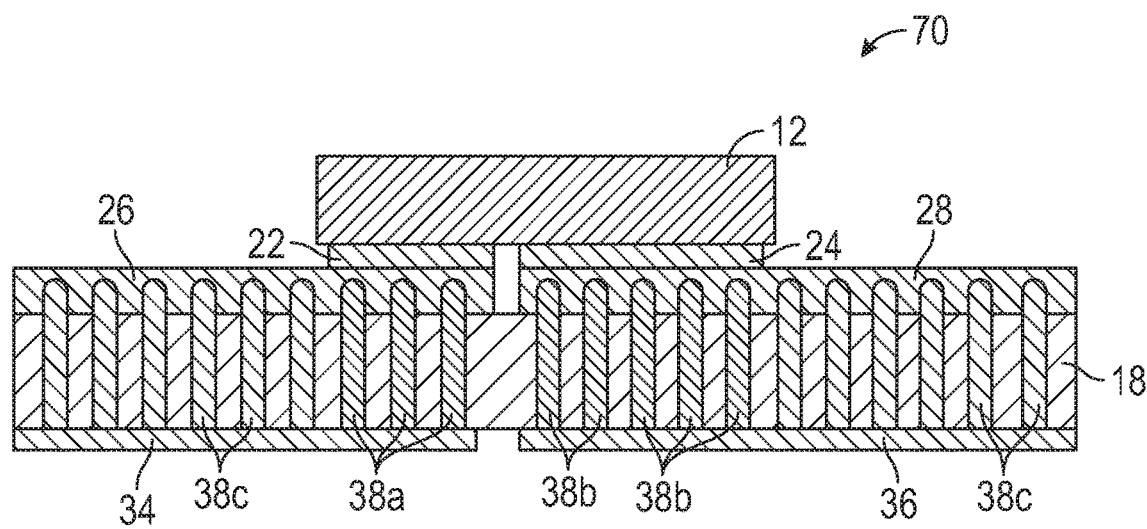
FIG. 9 is a cross-sectional view of an LED package that includes die attach pads having thicknesses configured to prevent protruding vias from extending completely through the die attach pads according to embodiments disclosed herein.

FIG. 9 is a cross-sectional view of an LED package 70 that includes first and second die attach pads 26, 28 having thicknesses configured to prevent protruding vias from extending completely through the die attach pads 26, 28 according to embodiments disclosed herein. The LED package 70 includes the LED chip 12 with the contact pads 22, 24 mounted on the submount 18 with the die attach pads 26, 28 and the package bond pads 34, 36 as previously described. The encapsulant (20 of FIG. 2A) may also be provided on the LED chip 12 and the submount 18 as previously described. The first plurality of vias 38a are registered with the first die attach pad 26 and the second plurality of vias 38b are registered with the second die attach pad 28 as previously described. In FIG. 9, the die attach pads 26, 28 comprise increased thicknesses such that any expanding or protruding of the vias 38a, 38b may extend less than an entire distance through either of the die attach pads 26, 28. In this manner, good thermal and electrical contact between the contact pads 22, 24 and the die attach pads 26, 28 is maintained. In certain embodiments, the first die attach pad 26 and the second die attach pad 28 comprise a thickness that is at least twice as high as previously described. For example, in certain embodiments, the thickness of the die attach pads 26, 28 can be up to about 200 μm, or in a range of about 10 μm to about 180 μm, or in a range of about 80 μm to about 160 μm. In certain embodiments, the submount 18 comprises one or more additional vias 38c that are arranged outside of a mounting area defined by lateral boundaries of the LED chip 12. In this regard, additional thermally conductive paths are provided so heat that may dissipate laterally in the die attach pads 26, 28 can in turn dissipate through the submount 18 outside of the mounting area of the LED chip 12.

According to certain embodiments disclosed herein, an LED package may include a submount with vias configured in arrangements that provide improved thermal dissipation for LED chips. In certain embodiments, at least some of the vias may be arranged in close proximity to one another in a manner that certain vias overlap with one another to form a trench via in the submount. In this manner, a trench via provides a larger area for heat that may be dissipated in localized areas of the submount. In certain embodiments, a submount may include combinations of individual vias and trench vias. For example, one or more trench vias may be arranged in a submount underneath a mounting area for an LED chip and other individual vias may be arranged in other areas of the submount. Accordingly, positions of vias and trench vias may be tailored within submounts to accommodate different heat profiles generated by different LED packages.

Figure 10A:
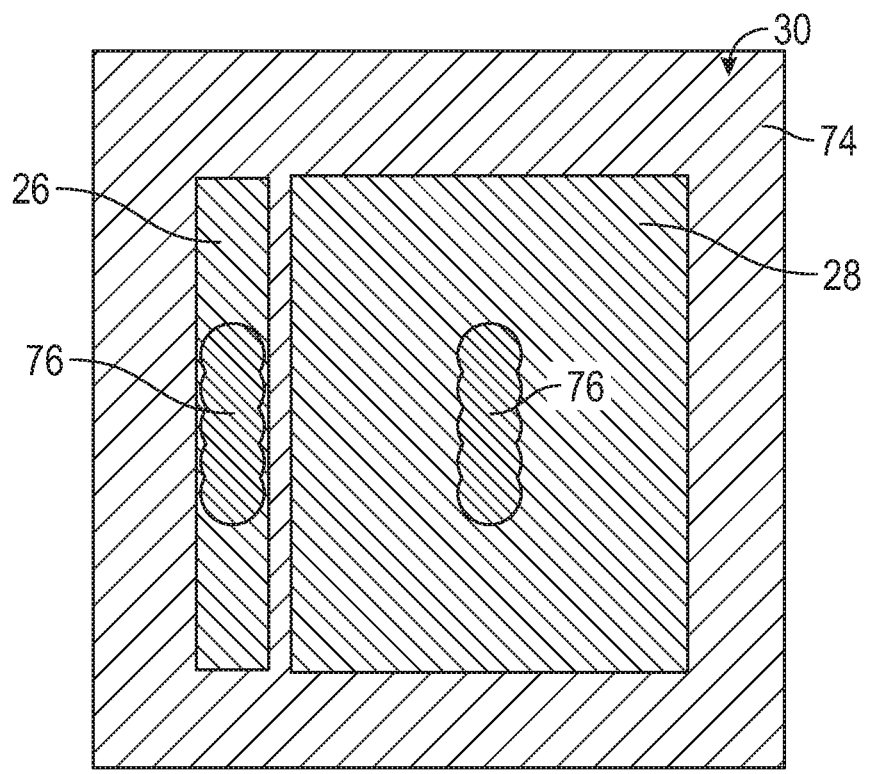
FIG. 10A is a top view of at least a portion of the first face of a submount that includes one or more trench vias according to embodiments disclosed herein.
Figure 10B:
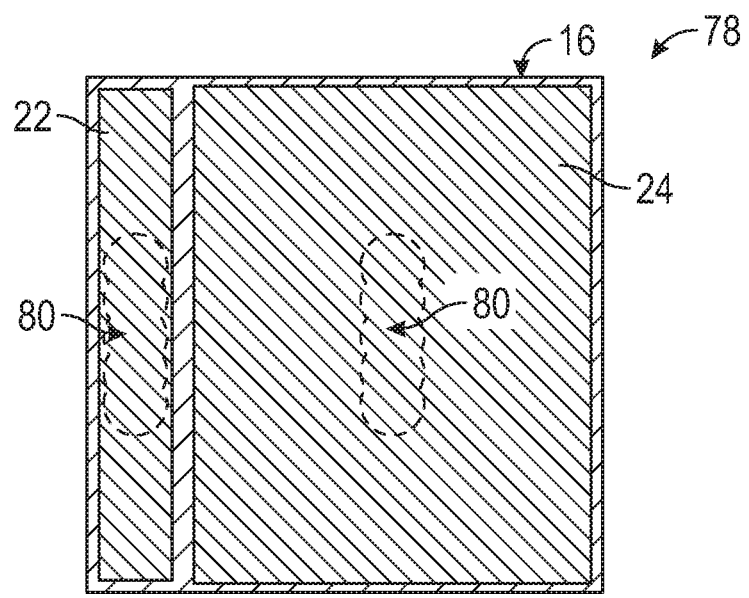
FIG. 10B is a bottom view of the mounting face of an LED chip that is configured to be mounted on the submount of FIG. 10A.

FIG. 10A is a top view of a portion of the first face 30 of a submount 74 that includes one or more trench vias 76 according to embodiments disclosed herein. The trench vias 76 may be formed by arranging multiple vias in close proximity to one another in a manner that certain vias overlap with one another to form the one or more trench vias 76 in the submount. By way of example, the trench vias 76 illustrated in FIG. 10A are formed by arranging five vias in close proximity to one another such that diameters or widths of the five vias overlap, thereby forming each trench via 76 that is continuous in the submount 74. As illustrated, each trench via 76 may comprise multiple curved edges corresponding to the five vias that overlap. While the trench vias 76 are illustrated as linear in FIG. 10A, in certain embodiments trench vias 76 may comprise one or more arcs or bends to form various nonlinear shapes in the submount 74. Trench vias 76 with nonlinear shapes may be formed by arranging multiple vias in close proximity to one another in nonlinear configurations. In certain embodiments, the trench vias 76 may be formed by other techniques, including continuously cutting or drilling a desired shape, e.g. linear or nonlinear, in the submount 74. In this manner, the trench vias 76 may be configured with edges that are different than the edges formed by overlapping vias as illustrated in FIG. 10A. For example, trench vias 76 may include elongated ovals, elongated rectangles, linear shapes, and nonlinear shapes with linear or nonlinear edges. The trench vias 76 provide localized areas with increased thermally conductive material for heat dissipation. In FIG. 10A, one of the trench vias 76 is registered with the first die attach pad 26, and another one of trench vias 76 is registered with the second die attach pad 28 of the submount 74. FIG. 10B is a bottom view of the mounting face 16 of an LED chip 78 that is configured to be mounted on the submount 74 of FIG. 10A. In certain embodiments, the first contact pad 22 and the second contact pad 24 of the LED chip 78 comprise corresponding trench openings 80. The trench openings 80 may be formed by overlapping openings or by a single continuous opening. When the LED chip 78 is mounted on the submount 74 of FIG. 10A, the trench openings 80 are configured to be registered with the trench vias 76 of FIG. 10A.

According to certain embodiments disclosed herein, LED packages with multiple LED chips may include one or more features configured to provide improved thermal and/or electrical coupling between the multiple LED chips and submounts. In certain embodiments, it is desirable for multiple LED chips to be mounted on a submount in close proximity to one another. In this manner, when the multiple LED chips are electrically activated, the multiple LED chips may appear as a larger emitting area for an LED package that is configured to operate at high output powers with increase power densities. The multiple LED chips may be configured to all generate the same color, or one or more of the LED chips may be configured to generate different colors. For LED packages with LEDs configured to generate different colors, having the multiple LEDs in close proximity to one another may additionally provide improved color mixing or provide an emitting area or a pixel that is capable of emitting different colors. When multiple LED chips are arranged in close proximity to one another, heat tends to cluster in areas of the submount that are central to the LED chips, thereby limiting operating powers and efficiencies of the LED chips. In certain embodiments, at least one thermally conductive element may be arranged between the multiple LED chips on a submount. The thermally conductive element may be positioned centrally to the multiple LED chips in areas where heat generation is the highest. In certain embodiments, the submount may further comprise a thermally conductive via that is registered with the thermally conductive element. In this manner, heat that tends to cluster between multiple LED chips may have a thermally conductive path away from the multiple LED chips.

Figure 11A:
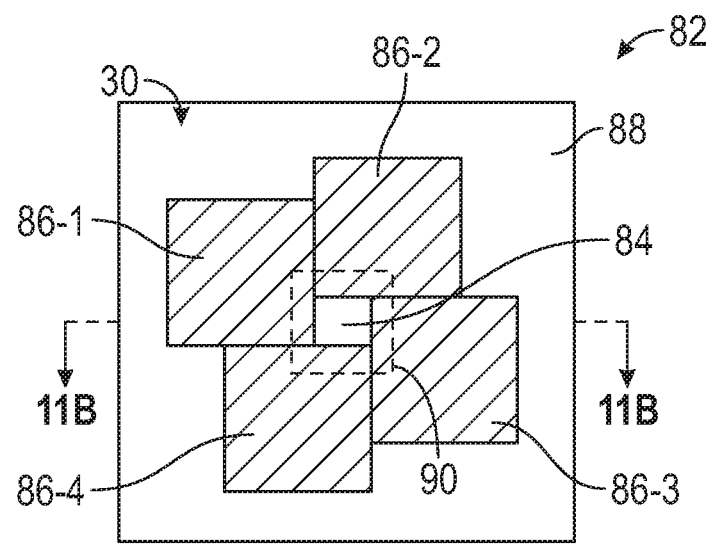
FIG. 11A is a top view of at least a portion of an LED package that includes a thermally conductive element arranged between a plurality of LED chips on a face of a submount according to embodiments disclosed herein.

FIG. 11A is a top view of at least a portion of an LED package 82 that includes a thermally conductive element 84 arranged between a plurality of LED chips 86-1 to 86-4 on a face of a submount 88 according to embodiments disclosed herein. As illustrated, the plurality of LED chips 86-1 to 86-4 are arranged on the first face 30 of the submount 88 in close proximity to one another. The LED chips 86-1 to 86-4 may all be configured to generate the same color of light, such as a white, or the LED chips 86-1 to 86-4 may be separately configured to generate different colors of light, such as different combinations of white, red, blue, and green light. The thermally conductive element 84 is arranged on the first face 30 and centrally positioned with regard to the LED chips 86-1 to 86-4. In certain embodiments, each LED chip of the LED chips 86-1 to 86-4 is arranged adjacent to a different lateral edge of the thermally conductive element 84. In this manner, heat generated by each of the LED chips 86-1 to 86-4 may conduct into the thermally conductive element 84. As illustrated in FIG. 11A, in order for all of the LED chips 86-1 to 86-4 to be arranged adjacent a different lateral edge of the thermally conductive element 84, the LED chips 86-1 to 86-4 are arranged in a pinwheel configuration where a corner of each of the LED chip 86-1 to 86-4 is arranged closest to a different corner of the thermally conductive element 84. In certain embodiments, the submount 88 comprises a via 90 that is thermally conductive and registered with the thermally conductive element 84. In FIG. 11A, the via 90 is illustrated with dashed lines to indicate it may not be visible in the top view. In certain embodiments, the via 90 is configured with a same cross-sectional width or diameter as the thermally conductive element 84. In other embodiments, the via 90 may be configured with a cross-sectional width or diameter that is larger or smaller than the thermally conductive element 84. In FIG. 11A, the dashed lines indicate the via 90 has a larger cross-sectional width or diameter and may accordingly provide increased heat dissipation for the LED chips 86-1 to 86-4. In certain embodiments, the configuration of the LED chips 86-1 to 86-4, the thermally conductive element 84, and the via 90 illustrated in FIG. 11A may be replicated and repeated across a larger area of the submount 88 to form an LED array.

Figure 11B:
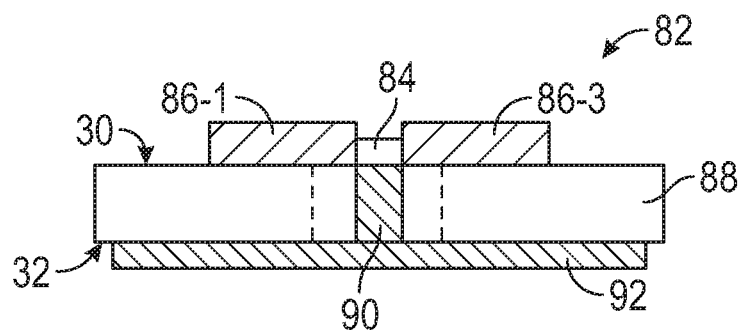
FIG. 11B is a cross-sectional view of the LED package of FIG. 11A taken along the section line labeled 11B in FIG. 11A.

FIG. 11B is a cross-sectional view of the LED package 82 taken along the section line labeled 11B in FIG. 11A. The LED chips 86-1 and 86-3 are visible in this cross-sectional view and are arranged adjacent to different lateral edges of the thermally conductive element 84. As illustrated, the via 90 extends between the first face 30 and the second face 32 of the submount 88. A package bond pad 92 is configured on the second face 32 of the submount 88 and registered with the via 90. In this manner, a thermally conductive path is provided from the LED chips 86-1, 86-3, through the thermally conductive element 84 and the via 90, and to the package bond pad 92. As previously described and indicated by the dashed lines in FIG. 11B, the via 90 may comprise a cross-sectional width or diameter that is the larger than a cross-sectional width or diameter of the thermally conductive element 84.

Figure 11C:
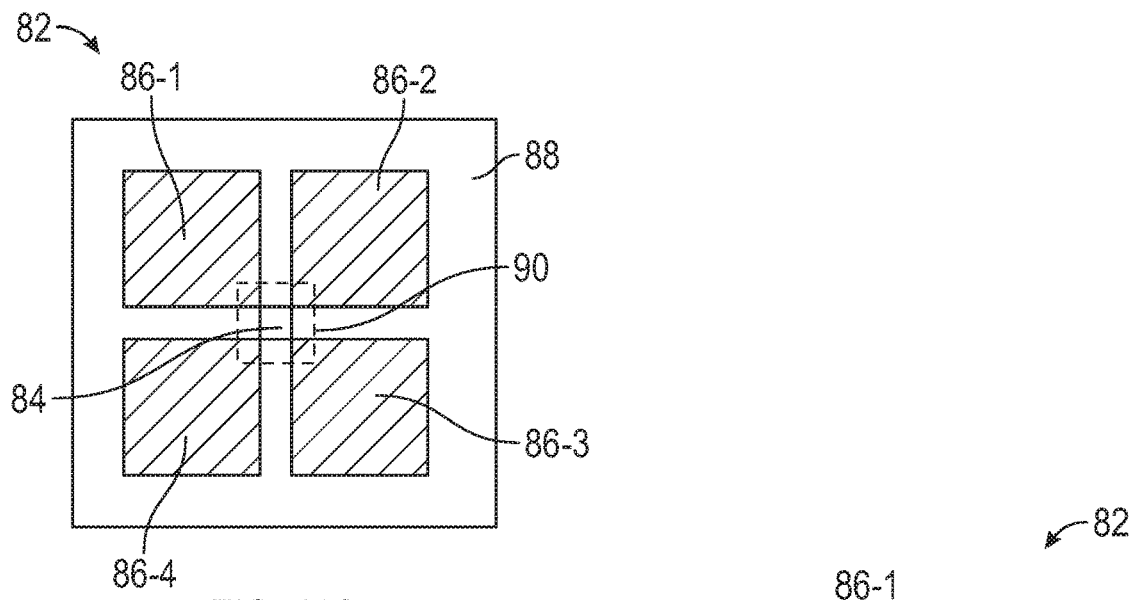
FIGS. 11C, 11D, and 11E are top views of at least portions of LED packages similar to the LED package of FIG. 11A, but with different arrangements of LED chips on the submount.
Figure 11D:
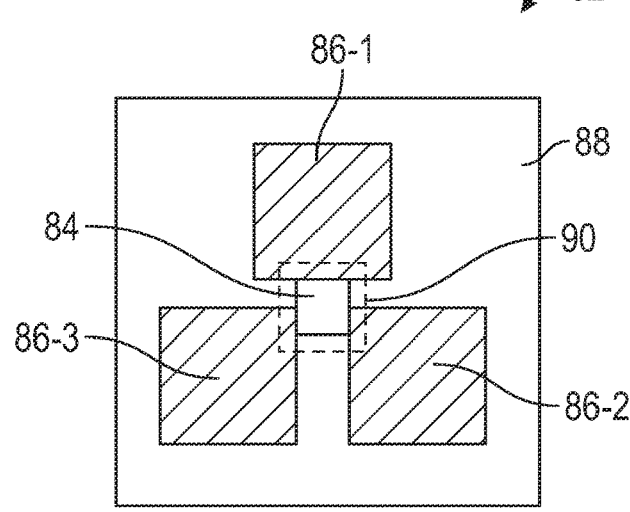
Figure 11E:
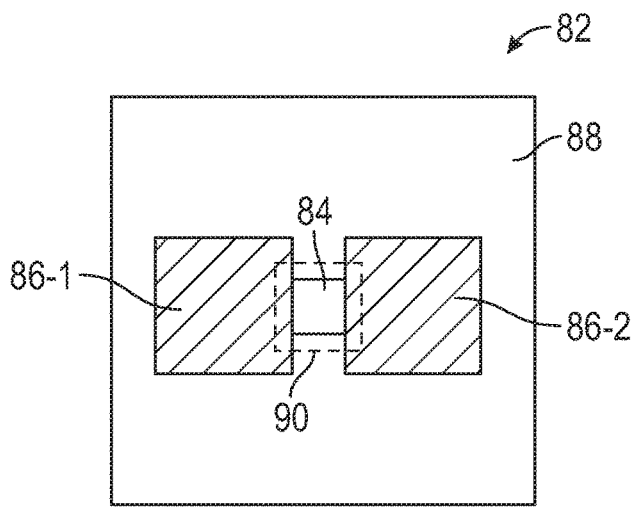

FIGS. 11C, 11D, and 11E are top views of LED packages 82 similar to the LED package 82 of FIG. 11A, but with different arrangements of LED chips on the submount 88. In FIG. 11C, the plurality of LED chips 86-1 to 86-4 are arranged such that a corner of each of the LED chips 86-1 to 86-4 is arranged closest to a different corner of the thermally conductive element 84. Rather than the pinwheel arrangement illustrated in FIG. 11A, the LED chips 86-1 to 86-4 are arranged outwardly from the thermally conductive element 84 and away from lateral edges of the thermally conductive element 84. In this configuration, the LED chips 86-1 to 86-4 are spaced further from one another around the thermally conductive element 84. In this manner, heat from each LED chip 86-1 to 86-4 has a further distance to travel to reach a different one of the LED chips 86-1 to 86-4. Heat may still tend to concentrate in positions central to the LED chips 86-1 to 86-4 and, accordingly, the thermally conductive element 84 and the via 90 are configured to provide a thermally conductive path away from the LED chips 86-1 to 86-4 and through the submount 88. In FIG. 11D, three LED chips 86-1 to 86-3 are arranged along or adjacent to three different lateral edges of the thermally conductive element 84. In FIG. 11E, two LED chips 86-1, 86-2 are arranged along or adjacent to two different lateral edges of the thermally conductive element 84. In certain embodiments, the two LED chips 86-1, 86-2 are arranged along or adjacent to two opposing lateral edges of the thermally conductive element 84. In FIG. 11D and FIG. 11E, the thermally conductive element 84 and the via 90 are configured to provide thermally conductive paths as previously described.

According to certain embodiments disclosed herein, LED packages are configured to provide improved thermal and/or electrical coupling between LED chips and lead frames. In certain embodiments, an LED chip is arranged in a flip-chip configuration on a subassembly that is then mounted to a lead frame in an LED package. The subassembly may comprise one or more die attach pads for the LED chip, one or more dielectric layers, and one or more thermally conductive layers. The subassembly may provide a planar surface for mounting with the lead frame, thereby providing improved thermal coupling between the LED chip and the lead frame. In certain embodiments, an underfill material may be arranged between the lead frame and the LED chip or the subassembly to provide improved mechanical support between the LED chip and the lead frame.

Figure 12:
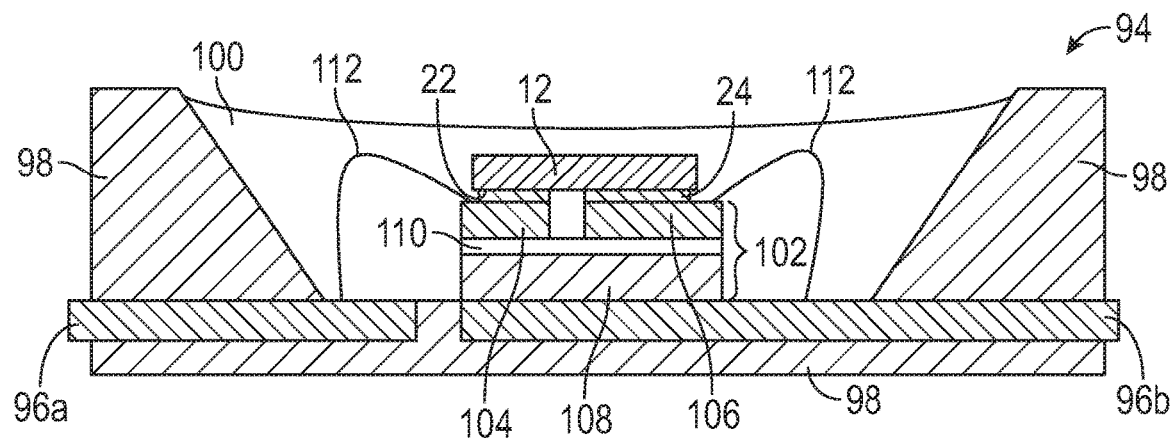
FIG. 12 is a cross-sectional view of an LED package that includes a lead frame according to embodiments disclosed herein.

FIG. 12 is a cross-sectional view of an LED package 94 that includes a lead frame 96a, 96b according to embodiments disclosed herein. The LED package 94 includes the LED chip 12 with contact pads 22, 24 as previously described. The LED chip 12 is mounted over the lead frame 96a, 96b. A first lead frame portion 96a may comprise an anode or a cathode for the LED package 94, and a second lead frame portion 96b may comprise the other of an anode or a cathode of the LED package 94. The first lead frame portion 96a is electrically isolated from the second lead frame portion 96b. The lead frame 96a, 96b is a structure typically formed of metal, such as copper, copper alloys, or other conductive metals. The lead frame 96a, 96b may initially be part of a larger metal structure that is singulated during manufacturing of LED packages. In certain embodiments of the LED package 94, an insulating material 98 is formed to surround portions of the lead frame 96a, 96b. In certain embodiments, the insulating material 98 is formed on the lead frame 96a, 96b before singulation so that the individual lead frame portions 96a, 96b may be electrically isolated from one another and mechanically supported in the LED package 94. The insulating material 98 may form reflective sidewalls of a cup or a recess in the LED package 94 where the LED chip 12 is mounted to the lead frame 96a, 96b. The lead frame portions 96a, 96b, which may respectively form the anode and cathode for the LED package 94, may be configured to protrude or be accessible outside of the insulating material 98 to provide external electrical connections for the LED package 94. An encapsulant material 100, such as silicone or epoxy, may fill the cup or recess to encapsulate the LED chip 12. In certain embodiments, a subassembly 102 is arranged between the LED chip 12 and the lead frame 96a, 96b. The subassembly 102 may comprise first and second die attach pads 104, 106 that are configured to be electrically coupled to different ones of the contact pads 22, 24 of the LED chip 12. In this manner, the LED chip 12 may be arranged in a flip-chip configuration on the first die attach pad 104 and the second die attach pad 106. The subassembly 102 may further comprise a submount 108 that is mounted to at least one lead frame portion 96b. In certain embodiments, the submount 108 comprises a thermally conductive material that is configured to provide a thermally conductive path from the LED chip 12 to the at least one lead frame portion 96b. In certain embodiments, the submount 108 comprises a metal with a thermal conductivity that is higher than other submount materials, such as aluminum oxide, alumina, AN, PCBs, sapphire, Si, or SiC. One or more dielectric layers 110 may be provided between the die attach pads 104, 106 and the submount 108 to provide electrical insulation. The subassembly 102 may further provide a uniform mounting surface that may be mounted to at least one of the lead frame portions 96a, 96b (96b in FIG. 12). Without the subassembly 102, the LED chip 12 may be flip-chip mounted directly to the lead frame 96a, 96b such that the first contact pad 22 is electrically and mechanically coupled to the first lead frame portion 96a, and the second contact pad 24 is electrically and mechanically coupled to the second lead frame portion 96b. Due to manufacturing variances common to lead frames, the first lead frame portion 96a may not be completely planar with the second lead frame portion 96b. In this manner, if the LED chip 12 is directly flip-chip mounted, uneven surfaces of the lead frame portions 96a, 96b may prevent the LED chip 12 from making sufficient electrical and thermal contact. In order to provide electrical connections with the LED chip 12, different wire bonds 112 may electrically couple the first lead frame portion 96a to the first die attach pad 104 and the second lead frame portion 96b to the second die attach pad 106.

Figure 13:
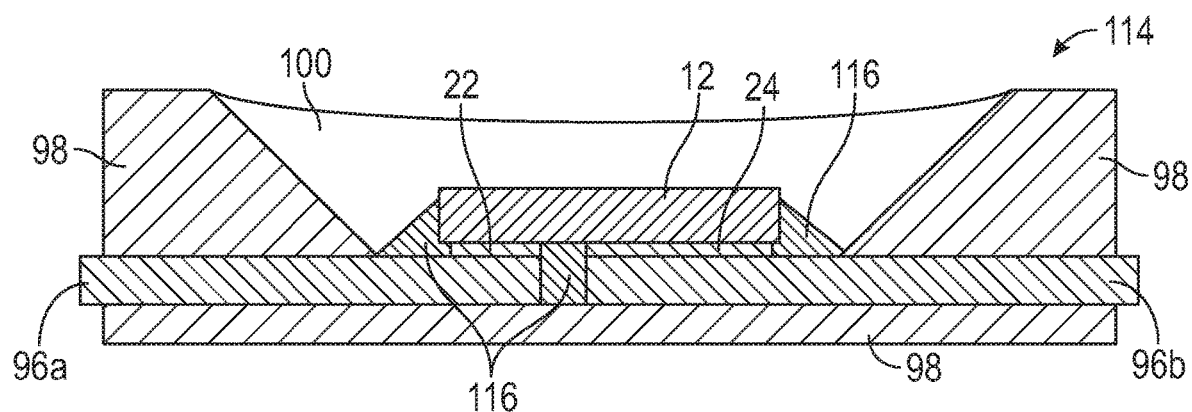
FIG. 13 is a cross-sectional view of an LED package that includes an underfill material configured to provide additional mechanical support between an LED chip and a lead frame.

FIG. 13 is a cross-sectional view of an LED package 114 that includes an underfill material 116 configured to provide additional mechanical support between the LED chip 12 and the lead frame 96a, 96b. As illustrated, the LED chip 12 is flip-chip mounted to the lead frame 96a, 96b such that the first contact pad 22 is electrically and mechanically coupled to the first lead frame portion 96a, and the second contact pad 24 is electrically and mechanically coupled to the second lead frame portion 96b. The underfill material 116 is arranged between the LED chip 12 and the lead frame 96a, 96b to provide additional mechanical support for the LED chip 12 to reduce the likelihood the LED chip 12 becomes separated from the lead frame 96a, 96b during operation. In certain embodiments, the underfill material 116 is arranged between the first lead frame portion 96a and the second lead frame portion 96b. The underfill material 116 may also be arranged between the first contact pad 22 and the second contact pad 24 of the LED chip 12 and between lateral edges of the LED chip 12 and the lead frame 96a, 96b. After forming the underfill material 116, the encapsulant material 100 as previously described may be arranged between sidewalls formed by the insulating material 98. In certain embodiments, the underfill material 116 comprises a material with a high durometer value on a Shore hardness scale (e.g., a high durometer silicone material). A material with a high durometer value, or hardness, in the underfill material 116 provides mechanical stability or anchoring for the LED chip 12. For example, the underfill material 116 may comprise a material, such as silicone, with a Shore D hardness scale durometer value of at least 40. In further embodiments, the underfill material 116 may comprise a material with a Shore D hardness scale durometer value in a range of from about 40 to about 100 or in a range from about 60 to about 80. In certain embodiments, the underfill material 116 includes a silicone material with a hardness that is higher than a silicone material of the encapsulant material 100. In other embodiments, the underfill material 116 comprises epoxy. In still further embodiments, the underfill material 116 comprises light altering particles, such as titanium dioxide (TiO$_2$) particles suspended in a silicone binder. In this manner, light generated by the LED chip 12 that travels in directions toward the lead frame 96a, 96b may be redirected out of the LED package 114.

Those skilled in the art will recognize improvements and modifications to the preferred embodiments of the present disclosure. All such improvements and modifications are considered within the scope of the concepts disclosed herein and the claims that follow.

What is claimed is:

1. A light emitting diode (LED) package, comprising:
   a submount comprising a first face, a second face that opposes the first face, a die attach pad on the first face, and at least one via that comprises an electrically conductive material, wherein the at least one via extends between the first face and the second face, and wherein the die attach pad is registered with the at least one via; and
   an LED chip comprising a contact pad that is coupled with the die attach pad, wherein the contact pad defines at least one opening that is registered with the at least one via.

2. The LED package of claim 1, wherein the die attach pad is electrically coupled with the at least one via.

3. The LED package of claim 1, wherein each opening of the at least one opening comprises a recess having a maximum depth smaller than a thickness of the contact pad.

4. The LED package of claim 1, wherein each opening of the at least one opening comprises an aperture extending through at least a portion of the contact pad.

5. The LED package of claim 1, wherein the at least one via comprises a plurality of vias, and wherein the die attach pad is registered with the plurality of vias.

6. The LED package of claim 5, wherein the at least one opening comprises a plurality of openings that are registered with the plurality of vias.

7. The LED package of claim 1, wherein the at least one via comprises a plurality of vias that overlap with one another to form a trench via.

8. The LED package of claim 7, wherein the at least one opening comprises a trench opening that is registered with the trench via.

9. The LED package of claim 1, wherein:
   the LED chip is one of a plurality of LED chips that is mounted on the submount;
   the at least one via comprises a plurality of vias; and
   the die attach pad is one of a plurality of die attach pads on the first face.

10. The LED package of claim 1, wherein the LED chip is a multiple-junction LED chip that is mounted on the submount.

11. The LED package of claim 1, wherein the at least one via comprises three vias that are positioned relative to one another in the submount to form vertices of a triangle.

12. A light emitting diode (LED) packages, comprising:
    a submount comprising a first face, a second face that opposes the first face, a first die attach pad on the first face, a second die attach pad on the first face, a first plurality of vias registered with the first die attach pad, and a second plurality of vias registered with the second die attach pad; and
    an LED chip comprising a primary light emitting face, a mounting face that opposes the primary light emitting face, an anode contact pad on the mounting face, and a cathode contact pad on the mounting face;
    wherein the anode contact pad is coupled with the first die attach pad, the cathode contact pad is coupled with the second die attach pad, and wherein the cathode contact pad defines a plurality of openings, and openings of the plurality of openings are registered with vias of the second plurality of vias.

13. The LED package of claim 12, wherein the first plurality of vias is electrically coupled with the first die attach pad, and the second plurality of vias is electrically coupled with the second die attach pad.

14. The LED package of claim 13, wherein the anode contact pad defines a plurality of openings that are registered with vias of the first plurality of vias.

15. The LED package of claim 12, wherein at least one of a via of the first plurality of vias and at least one of the vias of the second plurality of vias extends in the submount at an oblique angle between the first face and the second face.

* * * * *